United States Patent
Hu

(10) Patent No.: US 9,369,641 B2
(45) Date of Patent: Jun. 14, 2016

(54) MULTI-DEPTH-OF-FIELD LIGHT-SENSING DEVICE, AND SYSTEM AND METHOD FOR USE THEREOF HAVING PLURAL LIGHT-SENSING PIXEL LAYERS SENSE LIGHT SIGNALS WITH DIFFERENT WAVELENGTH BANDS FROM DIFFERENT DISTANCES

(75) Inventor: Xiaoping Hu, Guangdong (CN)

(73) Assignee: BOLY MEDIA COMMUNICATIONS (SHENZHEN) CO., LTD, Guangdong (CN)

( * ) Notice: Subject to any disclaimer, the term of this patent is extended or adjusted under 35 U.S.C. 154(b) by 154 days.

(21) Appl. No.: 14/128,921

(22) PCT Filed: Jun. 24, 2011

(86) PCT No.: PCT/CN2011/076338
§ 371 (c)(1),
(2), (4) Date: Mar. 7, 2014

(87) PCT Pub. No.: WO2012/174752
PCT Pub. Date: Dec. 27, 2012

(65) Prior Publication Data
US 2014/0183337 A1    Jul. 3, 2014

(51) Int. Cl.
| H04N 5/335 | (2011.01) |
| H01L 27/146 | (2006.01) |
| H04N 5/232 | (2006.01) |
| H04N 5/369 | (2011.01) |
| H04N 5/3745 | (2011.01) |

(52) U.S. Cl.
CPC .......... *H04N 5/335* (2013.01); *H01L 27/14621* (2013.01); *H01L 27/14625* (2013.01); *H01L 27/14627* (2013.01); *H01L 27/14641* (2013.01); *H01L 27/14647* (2013.01); *H01L 27/14652* (2013.01); *H04N 5/23212* (2013.01); *H04N 5/3696* (2013.01); *H04N 5/37457* (2013.01)

(58) Field of Classification Search
CPC    H01L 31/035; H01L 31/101; H04N 13/0022; H04N 2013/0081; H04N 5/355
USPC ..................... 250/208.1, 214.1, 239, 216; 257/440–444; 348/302–311
See application file for complete search history.

(56) References Cited

U.S. PATENT DOCUMENTS 7,593,556 B2 *  9/2009  Yasuda et al. ................. 382/128
9,054,001 B2 *  6/2015  Fukunaga

* cited by examiner

*Primary Examiner* — Que T Le
(74) *Attorney, Agent, or Firm* — Ohlandt, Greeley, Ruggiero & Perle, L.L.P.

(57) ABSTRACT

The present invention relates to a multi-depth-of-field light-sensing device, a system, a depth of field extension method, and an optical imaging system. The multi-depth-of-field light-sensing device includes at least two light-sensing pixel layers capable of inducing a light source, where the at least two light-sensing pixel layers are arranged at an interval of a preset distance, so that different light signals from a lens at a specific distance from the light-sensing device are focused to the different light-sensing pixel layers. The multi-depth-of-field light-sensing device of the present invention can implement automatic focusing without using any electrically operated mechanism or complex and precise mechanical component, and have good depth of field extension performance.

20 Claims, 15 Drawing Sheets

(a) (b)

(c) (d)

MULTI-DEPTH-OF-FIELD LIGHT-SENSING DEVICE, AND SYSTEM AND METHOD FOR USE THEREOF HAVING PLURAL LIGHT-SENSING PIXEL LAYERS SENSE LIGHT SIGNALS WITH DIFFERENT WAVELENGTH BANDS FROM DIFFERENT DISTANCES

BACKGROUND OF THE INVENTION

1. Field of the Invention

The present invention relates to the light-sensing field, and specifically, to a multi-depth-of-field light-sensing device, a light-sensing system using the multi-depth-of-field light-sensing device, a depth of field extension method, and an optical imaging system and method.

2. Related Art

The present invention is continuation to "multi-spectrum light-sensing device and manufacturing method for same" (PCT/CN2007/071262), "multi-spectrum light-sensing device and manufacturing method for same" (Chinese Application No: 200810217270.2), "multi-spectrum light-sensing device" (Chinese Application No: 200910105372.X), "multi-spectrum light-sensing device and sampling method for same" (Chinese Application No: 200910105948.2), and "light-sensing device and reading method for same, and reading circuit" (Chinese Application No: 200910106477.7) applied by the inventor at an earlier time, aiming to provide implementation of a more specific and preferable multi-spectrum light-sensing device at a chip and system grade.

A light-sensing system is a system which captures and collects a scene through an optical lens, and records the scene through a light-sensing device, such as a CMOS light-sensing chip. When the light-sensing system is working, a procedure of adjusting the lens to enable a scene at a distance from the lens to be clearly imaged is called focusing, and a point where the scene is located is referred to as a focusing point. "Clearness" is relative, so an image of a scene at a certain distance in front of (closer to the lens) or behind the focusing point can be clear, and the total sum of these front and rear ranges is referred to as depth of field. Generally the front depth of field is less than the rear depth of field, namely, after precise focusing, a scene only in a very short distance in front of the focusing point can be clearly imaged, while a scene in a very long distance behind the focusing point is clear.

A system for obtaining a clear image at a wide depth of field is one of research objectives of people for a long time. Research indicates that, the magnitude of the depth of field is relevant to the focal distance of the lens, a lens with a long focal distance has a small depth of field, and a lens with a short focal distance has a large depth of field. It can be seen that, to adjust the focal distance of the lens is one of means for obtaining a clear image at a wide depth of field; additionally, according to a basic imaging formula of geometrical optics $$\frac{1}{f} = \frac{1}{u} + \frac{1}{v},$$

(where f is the focal distance of the lens, u is the object distance, namely, a distance from a shot object to the lens, and v is the image distance, namely, a distance from the lens to the light-sensing device), it can be seen that, to dynamically adjust the image distance is also one of means for obtaining a clear image at a wide depth of field.

Therefore, the automatic focusing manner in the existing light-sensing system adopts one of the foregoing two means. For example, a lens is formed of a group of lens elements, and the distance between the lens elements is adjusted, so that the focal distance of the lens or the image distance (between the lens and the light-sensing device) can be adjusted (to implement optical zooming or focusing); or a CMOS light-sensing device for example is driven to shift, thereby changing the image distance (to implement optical focusing). However, evidently, focusing of these two manners both needs an electrically operated mechanism and a complex and precise mechanical component to drive shift of the lens elements or the light-sensing device. In this way, not only is the size prominently increased, but also cost and power consumption are prominently increased. In many applications, such as a mobile phone camera and a medical camera, these increases are obvious unfavorable factors.

Some wide depth of field systems without adopting any motion mechanism are therefore proposed in an attempt to replace the automatic focusing demand in some applications. This system is called EDoF (Extended Depth of Focus) in the application of a mobile phone camera. For example, in an EDoF system proposed by the DXO corporation, through particular lens design, red light-sensing pixels in a light-sensing device are focused at an infinitely far place, and blue light-sensing pixels are focused at a near distance as much as possible (such as 50 cm). However, green light-sensing pixels are focused at an intermediate location. In this way, no matter where an object is located, there is always an image whose color is distinct or relatively distinct. Afterwards, through a mathematical means, a distinct color is taken as a main body, and an insufficiently distinct color is taken as auxiliary information, so that a distinct image can be restored and calculated in a wide range.

However, if a single-layered light-sensing device is adopted, when red light-sensing pixels are focused at an infinitely far place, it is generally very difficult to make the focusing distance of blue light-sensing pixels less than 50 cm. Furthermore, for a light-sensing device adopting a Bayesian pattern, red pixels and blue pixels only each account for ¼ of light-sensing pixels. Therefore, when it is required to take red or blue as the main body of definition calculation, the resolution of an image is already reduced to a value below a half of the resolution obtained when green is taken as the main body. It can be seen that, this solution has some limitations.

Therefore, it is still necessary to improve the existing light-sensing device or system.

SUMMARY OF THE INVENTION

The technical problem to be solved by the present invention is to provide a multi-depth-of-field light-sensing device, a light-sensing system using the multi-depth-of-field light-sensing device, a depth of field extension method, and an optical imaging system and method, which implement automatic focusing or multi-distance imaging in a physical means without using any electrically operated mechanism or complex and precise mechanical component, and have good depth of field extension performance.

To solve the foregoing technical problem, the present invention adopts the following technical solutions.

A multi-depth-of-field light-sensing device includes at least two light-sensing pixel layers capable of inducing a light source, where the at least two light-sensing pixel layers are arranged at an interval of a preset distance, so that different light signals from a lens at a specific distance from the light-sensing device are focused to the different light-sensing pixel layers.

In an embodiment of the present invention, the light-sensing pixel layer includes at least one of a chemical coating light-sensing pixel layer and a semiconductor light-sensing pixel layer.

In an embodiment of the present invention, the chemical coating light-sensing pixel layer includes a quantum dot light-sensing pixel.

In an embodiment of the present invention, the semiconductor light-sensing pixel layer includes a CMOS light-sensing diode, a CMOS light-sensing gate, a CCD light-sensing diode, a CCD light-sensing gate, and a CMOS and CCD light-sensing diode and light-sensing gate having a bidirectional charge transfer function.

In an embodiment of the present invention, the different light signals include light signals at different distances, or light signals with different wavelengths.

In an embodiment of the present invention, a light signal with a shorter wavelength is focused to a light-sensing pixel layer closer to the lens.

In an embodiment of the present invention, the light-sensing pixel layer is double-layered, violet light, blue light, green light, or cyan light is focused to a light-sensing pixel layer closer to the lens, and green light, red light, yellow light, visible light, or infrared light is focused to a light-sensing pixel layer farther away from the lens.

In an embodiment of the present invention, the light-sensing pixel layer is three-layered, and ultraviolet light, blue light, or cyan light is focused to a light-sensing pixel layer closest to the lens; blue light, green light, red light, or yellow light is focused to an intermediate light-sensing pixel layer; red light, yellow light, visible light, or infrared light is focused to a light-sensing pixel layer farthest away from the lens.

In an embodiment of the present invention, a light signal at a farther distance is focused to a light-sensing pixel layer closer to the lens.

In an embodiment of the present invention, the light-sensing pixel layer is double-layered, an infinitely far light signal is focused to a light-sensing pixel layer closer to the lens, and a light signal at an interested shortest distance is focused to a light-sensing pixel layer farther away from the lens.

In an embodiment of the present invention, infinitely far violet light, blue light, green light, or cyan light is focused to a light-sensing pixel layer closer to the lens, and green light, red light, yellow light, visible light, or infrared light at an interested shortest distance is focused to a light-sensing pixel layer farther away from the lens.

In an embodiment of the present invention, the light-sensing pixel layer is three-layered, an infinitely far light signal is focused to a light-sensing pixel layer closest to the lens, a light signal at an interested shortest distance is focused to a light-sensing pixel layer farthest away from the lens, and a light signal at an intermediate distance between the infinitely far light signal and the light signal at the interested shortest distance is focused to an intermediate light-sensing pixel layer.

In an embodiment of the present invention, the light-sensing pixel layer is three-layered, infinitely far ultraviolet light, blue light, or cyan light is focused to a light-sensing pixel layer closest to the lens, red light, yellow light, visible light, or infrared light at an interested shortest distance is focused to a light-sensing pixel layer farthest away from the lens, and blue light, green light, red light, or yellow light at an intermediate distance between the infinitely far ultraviolet light, blue light, or cyan light and the red light, yellow light, visible light, or infrared light at the interested shortest distance is focused to an intermediate light-sensing pixel layer.

In an embodiment of the present invention, the interested shortest distance includes 2 mm, 5 mm, 7 mm, 1 cm, 2 cm, 3 cm, 5 cm, 7 cm, 10 cm, 20 cm, 30 cm, 40 cm, 50 cm, 60 cm, 70 cm, 80 cm, 100 cm, or 150 cm.

In an embodiment of the present invention, a light transmission layer is disposed between the at least two light-sensing pixel layers.

In an embodiment of the present invention, a light-sensing pixel in the light-sensing pixel layer is a front-side light-sensing pixel, a back-side light-sensing pixel, or a bidirectional light-sensing pixel.

In an embodiment of the present invention, when the light-sensing pixel is a bidirectional light-sensing pixel, a manner of selection of a direction by light-sensing thereof is selection of a direction by isolation, selection of a direction by time division, selection of a direction by area division, or selection of a direction by a pixel.

In an embodiment of the present invention, the light-sensing pixels in the light-sensing pixel layer each induce a complementary band or sub-band of ultraviolet, visible light, near-infrared, and far-infrared; or the chemical coating light-sensing pixel and the semiconductor light-sensing pixel each induce an orthogonal band or a sub-band of ultraviolet, visible light, near-infrared, and far-infrared.

In an embodiment of the present invention, the complementary band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum; and the orthogonal band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

In an embodiment of the present invention, color arrangement in each light-sensing pixel layer includes same arrangement, horizontal arrangement, vertical arrangement, diagonal arrangement, generalized Bayesian arrangement, YUV422 arrangement, transverse YUV422 arrangement, honeycomb arrangement, and uniform arrangement.

In an embodiment of the present invention, a light filtering film is disposed at a front-side, a back-side or two sides of part or all of the light-sensing pixels in the at least one light-sensing pixel layer, and frequency selection characteristics of the light filtering film include infrared cut-off filtering, blue band-pass, green band-pass, red band-pass, cyan band-pass, yellow band-pass, pinkish red band-pass, or visible light band-pass.

In an embodiment of the present invention, two neighboring layers of the light-sensing pixel layers are each provided with a reading circuit; or two neighboring layers of the light-sensing pixel layers share a reading circuit.

In an embodiment of the present invention, the reading circuit is a reading circuit for an active pixel, a reading circuit for a passive pixel, or a mixed reading circuit for an active pixel and a passive pixel.

In an embodiment of the present invention, the active pixel includes an active pixel 3T, 4T, 5T or 6T.

In an embodiment of the present invention, a sharing manner of the reading circuit includes a single-layered or upper-and-lower-layer 4-point sharing manner, a single-layered or upper-and-lower-layer 6-point sharing manner, a single-layered or upper-and-lower-layer 8-point sharing manner, or a single-layered or upper-and-lower-layer any-number-of-point sharing manner.

In an embodiment of the present invention, the reading circuit includes a first combining unit configured to perform pair-wise combining and sampling on proximate same-row different-column, different-row same-column, or different-row different-column pixels in a pixel array of each light-sensing pixel layer, to obtain sampling data of a first combining pixel; and a second combining unit configured to perform combining and sampling on the sampling data of the first combining pixel obtained by the first combining unit to obtain sampling data of a second combining pixel.

In an embodiment of the present invention, the reading circuit further includes a third combining unit, configured to perform combining and sampling on the sampling data of the second combining pixel obtained by the second combining unit to obtain sampling data of a third combining pixel.

In an embodiment of the present invention, a pixel combining manner of the first combining unit or the second combining unit is a charge addition manner between same or different color pixels, where the pixel combining manner between different color pixels conforms to a manner of color space conversion, so as to satisfy a color reconstruction requirement.

In an embodiment of the present invention, the color space conversion includes space conversion from RGB to CyYeMgX, space conversion from RGB to YUV, or space conversion from CyYeMgX to YUV, where X is any one of R (red), G (green), and B (blue).

In an embodiment of the present invention, the charge addition manner is completed by directly connecting pixels in parallel or simultaneously transferring charges into a reading capacitor (FD).

In an embodiment of the present invention, a color based combining and sampling manner of the first combining unit or the second combining unit includes a same-color combining manner, a different-color combining manner, a hybrid combining manner, or a combining manner of selectively abandoning surplus colors, and the combining and sampling manner adopted by the first combining unit and the combining and sampling manner adopted by the second combining unit are not the same-color combining manner simultaneously.

In an embodiment of the present invention, a location based combining and sampling manner of the first combining unit or the second combining unit includes at least one of the following several manners: an automatic average manner for a signal directly output to a bus, a row-skipping or column-skipping manner, and a one-by-one sampling manner.

In an embodiment of the present invention, a combining and sampling manner of the third combining unit includes: at least one of a color space conversion manner and a backend digital image zoom manner.

In an embodiment of the present invention, a global electronic shutter having a cross-layer reading function is included, where the global electronic shutter includes a plurality of light-stable transfer and reading pixels capable of transferring and reading a charge or voltage value of one or more light-sensing pixel layers simultaneously.

In an embodiment of the present invention, the plurality of light-stable transfer and reading pixels is located at a light-stable pixel transfer and reading layer; or located at the light-sensing pixel layer.

In an embodiment of the present invention, each light-sensing pixel layer is disposed with a proximate light-stable pixel transfer and reading layer.

In an embodiment of the present invention, the light-stable transfer and reading pixel is made by a semiconductor circuit.

The present invention also provides a depth of field extension method, including:

disposing, in a light-sensing device, at least two light-sensing pixel layers capable of inducing a light source, and arranging the at least two light-sensing pixel layers at an interval of a preset distance, so that different light signals from a lens at a specific distance from the light-sensing device are focused to the different light-sensing pixel layers.

In an embodiment of the present invention, a clear image is obtained through images with different definitions and from different light-sensing pixel layers.

The present invention further provides an optical imaging method, including:

disposing a lens and a light-sensing device including at least two light-sensing pixel layers capable of inducing a light source; and placing the light-sensing device at a specific distance from the lens, and arranging the at least two light-sensing pixel layers at an interval of a preset distance, so that different light signals from the lens are focused to the different light-sensing pixel layers.

The present invention further provides an optical imaging system, including a lens and a multi-depth-of-field light-sensing device, where the multi-depth-of-field light-sensing device is arranged at a specific distance from the lens, and includes at least two light-sensing pixel layers capable of inducing a light source, where the at least two light-sensing pixel layers are arranged at an interval of a preset distance, so that different light signals from the lens are focused to the different light-sensing pixel layers.

In an embodiment of the present invention, the different light signals include light signals at different distances, or light signals with different wavelengths.

In an embodiment of the present invention, a light signal with a shorter wavelength is focused to a light-sensing pixel layer closer to the lens.

In an embodiment of the present invention, a light signal at a farther distance is focused to a light-sensing pixel layer closer to the lens.

The present invention further provides a light-sensing system, including the foregoing light-sensing device.

In an embodiment of the present invention, the light-sensing system includes one of a digital camera, a camera mobile phone, a camcorder, a video or camera monitoring system, an image identifying system, a medical image system, a military, fire fighting or underground image system, an automatic tracking system, a three-dimensional image system, a machine vision system, an automobile vision or driving assistance system, an electronic game system, a network camera, an infrared and night view system, a multi-spectrum imaging system, and a computer camera.

In the existing light-sensing system, the automatic focusing system needs an electrically operated mechanism and a complex and precise mechanical component, and for a lens with a diameter above 6 mm, in order to implement wide-distance automatic focusing from 10 cm to an infinitely far place, the travel distance of the lens has to be above 0.2 mm, that is to say, the difference between an image distance of clear imaging at an infinitely far place and an image distance of clear imaging at 10 cm is at least 0.2 mm, namely, 200 μm. It is well known that, silicon or other semiconductor materials are all opaque. After light enters silicon, at a place of about 12 μm, the light is already absorbed to an extent that there is not much left. Therefore, even if an automatic focusing system is used, it is also very difficult for the existing light-sensing system to obtain a wide range of depth of field.

In the multi-depth-of-field light-sensing device, the light-sensing system using the multi-depth-of-field light-sensing device, the depth of field extension method, and the optical imaging system and method of the present invention, at least two light-sensing pixel layers capable of inducing a light source are disposed, where the at least two light-sensing pixel layers are arranged at an interval of a preset distance, so that different light signals from a lens at a specific distance from the light-sensing device are focused to different light-sensing pixel layers, and therefore the different light-sensing pixel layers can obtain images of different depths of field. From the perspective of products, a light-sensing device can be manufactured into an independent light-sensing chip, but from the perspective of applications, such as optical imaging, a light-sensing device generally needs to be used in cooperation with a lens. A lens has different focusing characteristics according to its size, material, and curve design. For example, an ordinary mobile phone lens is used as an example, its depth of field range generally is from an infinitely far place to a place at 2 m, and if the depth of field range is exceeded, an automatic focusing technology needs to be adopted. For example, a clear scene such as at 50 cm to 30 cm can be obtained only when the distance from the light-sensing device to the lens is adjusted, namely, the image distance is adjusted to an appropriate value. However, in the present invention, if a selected application lens is a mobile phone lens, two light-sensing pixel layers (called a first light-sensing pixel layer and a second light-sensing pixel layer) can be disposed in a light-sensing device according to the following example. During cooperation with the selected mobile phone lens, the light-sensing device is placed at a specific distance from the lens. At this time, the distance from the first light-sensing pixel layer to the lens is a first image distance, and the distance from the second light-sensing pixel layer to the lens is a second image distance (the first image distance is less than the second image distance). At this time, the specific distance from the lens and the preset distance between the two light-sensing pixel layers enable a scene in the depth of field range from an infinitely far place to a place at 2 m to be clearly imaged at the first light-sensing pixel layer, and a scene in the depth of field range from 50 cm to 30 cm to be clearly imaged at the second light-sensing pixel layer. Therefore, two depths of field or depth of field extension is implemented. It should be noted that, in the foregoing illustration example, the number of light-sensing pixel layers and the depth of field range are both only exemplary data. It can be understood that, by adjusting the number of light-sensing pixel layers and the preset distance between the light-sensing pixel layers, consecutive, overlapping, complementary, or orthogonal depth of field ranges can be formed, and respective depth of field ranges of a plurality of light-sensing pixel layers are superimposed so that the light-sensing device has a considerably wide depth of field range, thereby obtaining a clear image in a wide depth of field range without automatic focusing, avoiding use of any electrically operated mechanism or complex and precise mechanical component, and prominently saving space and cost. In another aspect, in the present invention, generally, complete image information at least can be obtained from a light-sensing pixel layer, so that the image has a considerably high definition, and tedious mathematical calculation is not required.

The present invention describes the innovative and powerful mixed multi-spectrum light-sensing pixel group, light-sensing device and system through embodiments. These preferable implementation manners are merely exemplified to illustrate advantages and implementation methods of the present invention, and are not intended to limit the protection scope of the present invention.

The foregoing objectives and advantages and other objectives and advantages of the present invention are very obvious after a person skilled in the art reads the following detailed description about preferable implementation cases with a plurality of illustrations and explanations.

BRIEF DESCRIPTION OF THE DRAWINGS

FIG. 15 and FIG. 16 each only depict a light-sensing pixel situation, where other reading circuits and auxiliary circuits are all omitted because they can be the same as those in the prior art;

for an embodiment of a double-layered semiconductor light-sensing pixel layer, such as FIG. 8 and FIG. 15, if light-sensing pixels of one of the light-sensing pixel layers are removed to make a layer dedicated to a reading circuit and signal processing, a light-sensing device with a global electronic shutter (having a cross-layer reading function) proposed in the present invention shown in FIG. 20 to FIG. 23 can be obtained.

FIG. 20 is a schematic diagram of a transfer pixel of sharing one row of two rows (reading capacitor) proposed in the present invention, where this actually is a new implementation of an interleaving scanning manner in "light-sensing device and reading method for same, and reading circuit" (Chinese Application No: 200910106477.7); here, transfer pixels and light-sensing pixels are not at a same layer, so better use efficiency of the light-sensing area can be obtained, but simultaneously the shutter speed is doubled; importantly, this manner can be used for a light-sensing device with a chemical light-sensing material (such as, quantum light-sensing film) as a light-sensing pixel layer;

FIG. 21 shows that bad light transmission performance of semiconductor is utilized, and the thickness of a semiconductor base layer is increased to a certain thickness, so that a pixel of a lower layer senses no light; then, by use of metal perforation or surface routing, in an external connection manner, a signal of a light-sensing pixel of the upper layer is induced onto a reading pixel of a light-stable pixel layer through a diode or reading amplification switching circuit, where sampling and reading are performed, thereby degenerating a double-layered light-sensing device into a single-layered light-sensing device with a global electronic shutter (having a cross-layer reading function); this device is double-layered in the structure, but is single-layered in the effect; when this manner is used for the multi-layered light-sensing device shown in FIG. 17 (a), a multi-depth-of-field light-sensing device with a global electronic shutter (having a cross-layer reading function) can be obtained;

FIG. 22 is a schematic diagram of a multi-spectrum double-layered light-sensing device with a global electronic shutter (having a cross-layer reading function) on the basis of a conventional (CMOS and CCD) semiconductor circuit proposed in the present invention, where likewise, transfer of a signal of a light-sensing pixel onto a light-stable reading pixel is controlled by a diode or an amplification switching circuit;

FIG. 23 is a schematic diagram of another multi-spectrum double-layered light-sensing device with a global electronic shutter (having a cross-layer reading function) on the basis of a chemical light-sensing material (such as, quantum light-sensing film) proposed in the present invention, where a light-sensing pixel layer is made of a chemical light-sensing material (such as, quantum light-sensing film), while a reading circuit and signal processing layer is a CMOS semiconductor layer; it is noted that in the example of the drawing, each light-sensing pixel correspondingly has a light-stable charge transfer pixel, which is used for implementing a global electronic shutter; this is also a degeneration particularly performed by the multi-layered light-sensing device in order to simply implement a global electronic shutter;

DETAILED DESCRIPTION OF THE EMBODIMENTS

Figure 1:
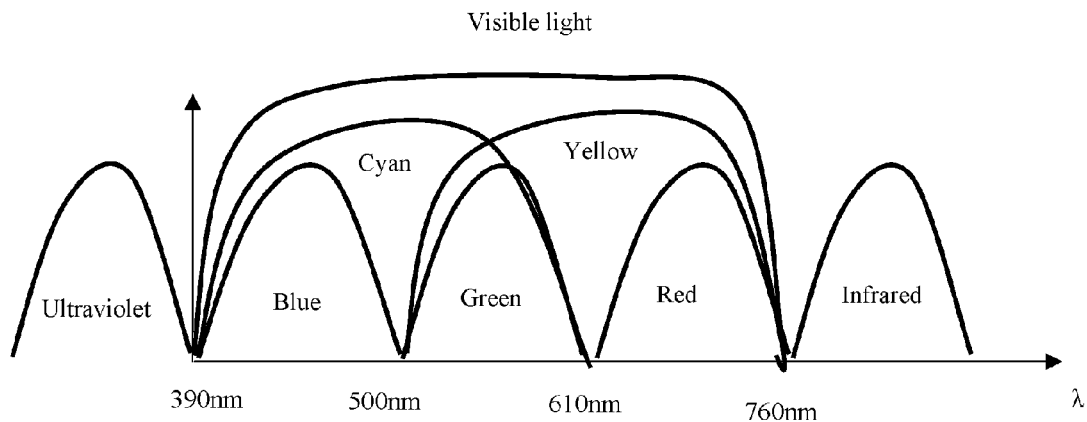
FIG. 1 is a schematic diagram of a spectrum distribution, where visible light generally refers to light with wavelength ranging from 390 nm to 760 nm; generally, for light which is visible through the light splitting effect of a prism, wavelength of blue light ranges from 440 to 490 nm, wavelength of green light ranges from 520 to 570 nm, wavelength of red light ranges from 630 to 740 nm, while in design for a light-sensing device, generally, an area of 390 to 500 nm is classified as a blue area, an area of 500 to 610 nm is classified as a green area, an area of 610 to 760 nm is classified as a red area, but this division of bands of red, green, and blue is not absolute; wave forms of red, green, blue, cyan (composite of blue and green), and yellow (composite of green and red) in the drawing are ideal wavelength response curves required by a primary-color light-sensing pixel or complementary-color (composite color) light-sensing pixel; if the primary-color light-sensing pixel or complementary-color (composite color) light-sensing pixel as a base color is not provided with a similar wavelength response curve, it is very difficult to reconstruct an overwhelming majority of colors which are visible to human beings.

The present invention is further illustrated in detail below through specific implementation manners with reference to accompanying drawings.

A main use of a multi-depth-of-field light-sensing device to be proposed in the present invention is depth of field extension, namely, currently called EDoF (namely, Extended Depth of Focus) in the mobile phone industry. The depth of field extension is very widely applied to a camera mobile phone particularly. However, the current depth of field extension mainly uses optical and mathematical means, and generally the depth of field is adjusted in an optical zooming or automatic focusing manner, which requires cooperation between an electrically operated mechanism and a complex and precise mechanical component, so space and cost are prominently increased.

A multi-depth-of-field light-sensing device proposed in an embodiment of the present invention in combination with implementation of a multi-layered light-sensing device, includes at least two light-sensing pixel layers capable of inducing a light source, where the at least two light-sensing pixel layers are arranged at an interval of a preset distance, so that different light signals from a lens at a specific distance from the light-sensing device are focused to different light-sensing pixel layers; therefore, different light-sensing pixel layers form light-sensing planes having different image distances, different depths of field can be fixedly focused, thereby extending the depth of field range of the light-sensing device, which is equivalent to implementation of automatic focusing from this physical means of multi-point optical focusing, correspondingly the cooperation between an electrically operated mechanism and a complex and precise mechanical component can be removed, and space and cost are prominently saved.

The light-sensing pixel layer includes at least one of a chemical coating light-sensing pixel layer and a semiconductor light-sensing pixel layer. Namely, the foregoing at least two light-sensing pixel layers can both be chemical coating light-sensing pixel layers, or both be semiconductor light-sensing pixel layers, or a part thereof is a chemical coating light-sensing pixel layer, and a part thereof is a semiconductor light-sensing pixel layer. The chemical coating light-sensing pixel layer includes a quantum dot light-sensing pixel. The semiconductor light-sensing pixel layer includes a CMOS light-sensing diode, a CMOS light-sensing gate, a CCD light-sensing diode, a CCD light-sensing gate, and a CMOS and CCD light-sensing diode and light-sensing gate having a bidirectional charge transfer function.

The foregoing light-sensing pixel layers are each used for inducing different light signals. In the present invention, cared light signal characteristics mainly include a light signal frequency spectrum characteristic, namely, light wavelength, and a light signal distance characteristic, namely, a distance from a light signal to a lens. Therefore, that light signals are different refers to that at least one of the foregoing two characteristics of two light signals is different, namely, two light signals may be different in the wavelength, or different in the distance, or different in both the wavelength and the distance. Definitely, because compound-color light is common in nature, such as white light, so if light with different wavelengths needs to be obtained, generally it needs to cooperate with lens design, different refractive indexes of light with different wavelengths are designed by use of such as the light splitting effect of a prism, a lens material or a curve to enable the light with different wavelengths to be separated and focused onto different light-sensing pixel layers.

Light signals with different wavelengths are focused, and generally, a light signal with a shorter wavelength is focused to a light-sensing pixel layer closer to the lens. For example, if the light-sensing pixel layer is double-layered, a light signal focused to a light-sensing pixel layer closer to the lens is violet, blue light, cyan, or green light, and a light signal focused to a light-sensing pixel layer farther away from the lens is green light, red light, yellow light, visible light (white light), or infrared light. For another example, if the light-sensing pixel layer is three-layered, a light signal focused to a light-sensing pixel layer closest to the lens is ultraviolet light, blue light, or cyan light; a light signal focused to an intermediate light-sensing pixel layer is green light, blue light, yellow light, red light, or visible light (white light); and a light signal focused to a light-sensing pixel layer farthest away from the light source is red light, yellow light, visible light, or infrared light.

Light signals with different distances are focused, and generally, a light signal at a farther distance is focused to a light-sensing pixel layer closer to the lens. For example, if the light-sensing pixel layer is double-layered, an infinitely far light signal is focused to a light-sensing pixel layer closer to the light source, and an interested shortest distance light signal is focused to a light-sensing pixel layer farther away from the light source. In combination with the focused light with different wavelengths, the following setting can be further made: infinitely far ultraviolet light, blue light, cyan light, or green light is focused to a light-sensing pixel layer closer to the light source; green light, red light, yellow light, visible light (white light), or infrared light at an interested shortest distance is focused to a light-sensing pixel layer farther away from the light source.

For another example, if the light-sensing pixel layer is three-layered, an infinitely far light signal is focused to a light-sensing pixel layer closest to the light source, an interested shortest distance light signal is focused to a light-sensing pixel layer farthest away from the light source, and a light signal at an intermediate distance between an infinitely far place and the interested shortest distance is focused to an intermediate light-sensing pixel layer. In combination with the focused light with different wavelengths, the following setting can be further made: infinitely far ultraviolet light, blue light, cyan light, or green light is focused to a light-sensing pixel layer closest to the light source; green light, blue light, yellow light, red light, or visible light (white light) at an intermediate distance between an infinitely far place and the interested shortest distance is focused to an intermediate light-sensing pixel layer; red light, yellow light, visible light, or infrared light at an interested shortest distance is focused to a light-sensing pixel layer farthest away from the light source.

In an implementation manner, the interested shortest distance includes 2 mm, 5 mm, 7 mm, 1 cm, 2 cm, 3 cm, 5 cm, 7 cm, 10 cm, 20 cm, 30 cm, 40 cm, 50 cm, 60 cm, 70 cm, 80 cm, 100 cm, or 150 cm. The so-called interested shortest distance refers to the closest distance from a user-cared scene to the lens. For example, the interested shortest distance is 2 mm, it means that the closest distance from a user-cared scene to the lens is 2 mm, and when the distance from the scene to the lens is less than 2 mm, the user does not care the scene anymore.

Figure 13:
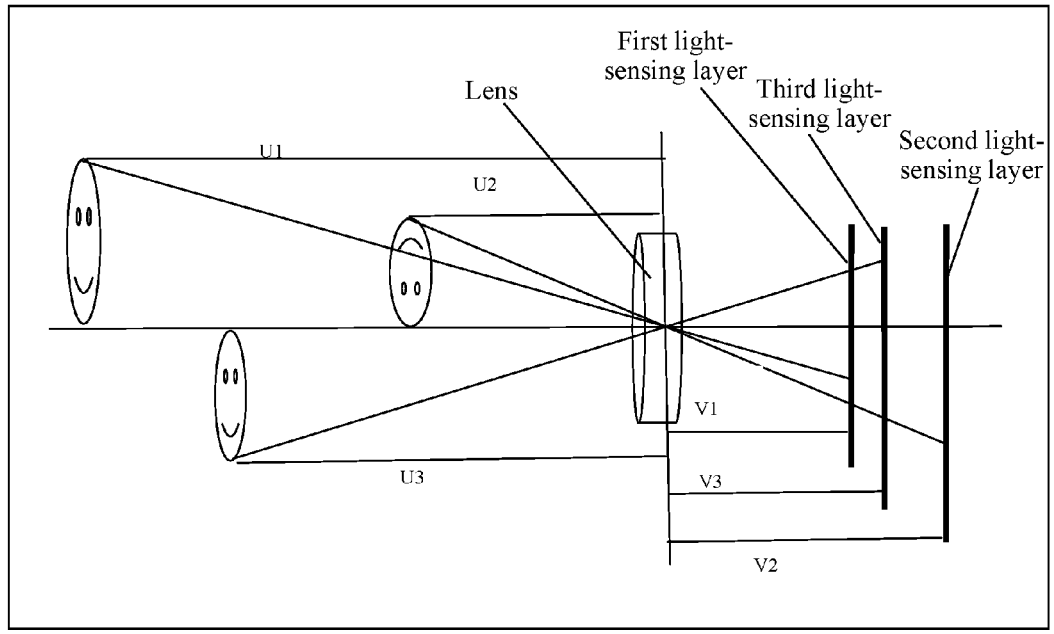
FIG. 13 is a schematic diagram of a first principle for implementing depth of field extension by using a multi-layered light-sensing device, where in this schematic diagram, objects located at different distances are clearly focused at different light-sensing pixel layers of the multi-layered light-sensing device, so, any one object located between these three distances is distinctly or comparatively distinctly focused at one or two light-sensing pixel layers, thereby achieving the depth of field extension effect; in the drawing, U1, U2, or U3 is an object distance (namely, a distance from an object to a lens), and V1, V2, or V3 is an image distance (namely, a distance from a light-sensing pixel layer to the lens)

FIG. 13 shows a relationship between a distance and a focusing plane. In this diagram, objects located at different distances are clearly focused at different light-sensing pixel layers of the multi-layered light-sensing device, so, any one object located between these three distances is distinctly or comparatively distinctly focused at one or two light-sensing pixel layers, thereby being capable of obtaining their clear images from a same light-sensing device simultaneously.

Figure 14:
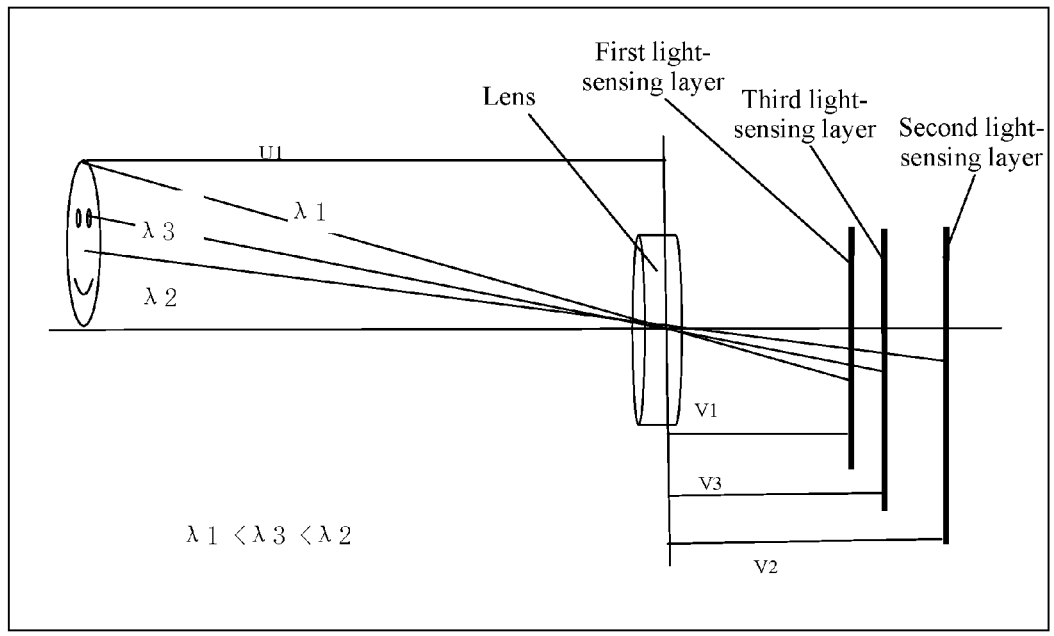
FIG. 14 is a schematic diagram of a second principle for implementing better depth of field extension effect by using a special lens design method and a multi-layered light-sensing device simultaneously, where for a general optical system, the shorter the wavelength of light is, the shorter the focal distance is, so a lens is particularly designed so that light with a shorter wavelength can be focused at a light-sensing pixel layer closer to the lens, or, a light-sensing pixel layer closer to a light source; light with a longer wavelength is focused at a light-sensing layer farther to the lens, or, a light-sensing pixel layer farther to the light source; light with an intermediate wavelength is focused at an intermediate light-sensing layer; in this way, this imaging system combines characteristics of multi-spectrum and multi-image-distance simultaneously, and the depth of field can be greatly extended; this system has peerless advantages for macro photography.
Figure 15:
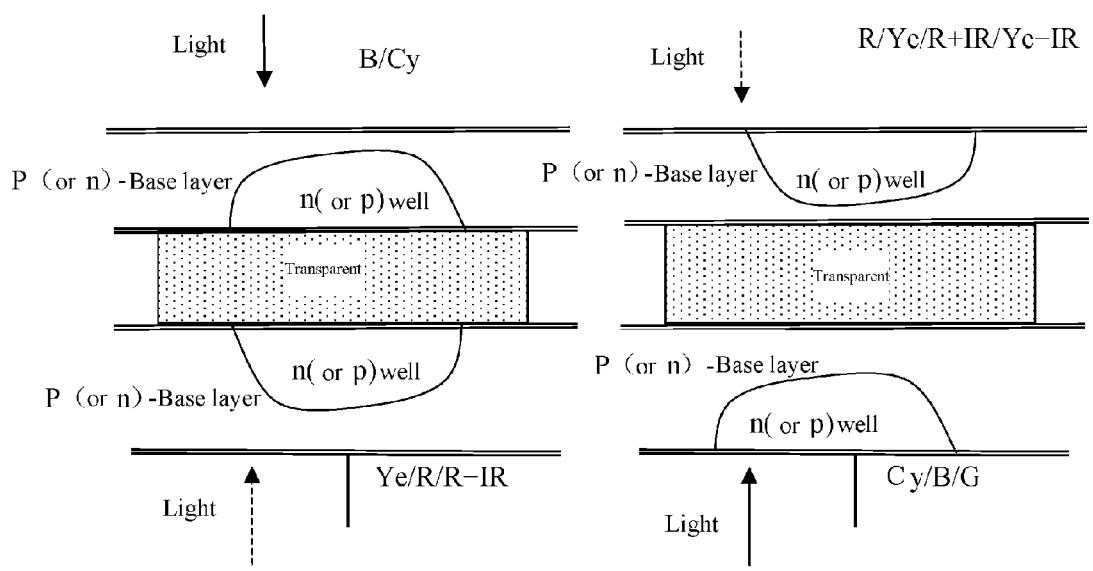
FIG. 15 is a schematic principle diagram of implementing a light-sensing pixel grade of the multi-depth-of-field light-sensing device shown in FIG. 11, where by adjusting the thickness of a light transmission layer, the distance between two light-sensing pixel layers can be adjusted, so that light-sensing pixels of the two light-sensing pixel layers are respectively corresponding to different depths of field; in the example, two upper and lower light-sensing pixel layers each adopt a semiconductor light-sensing pixel layer.
Figure 16:
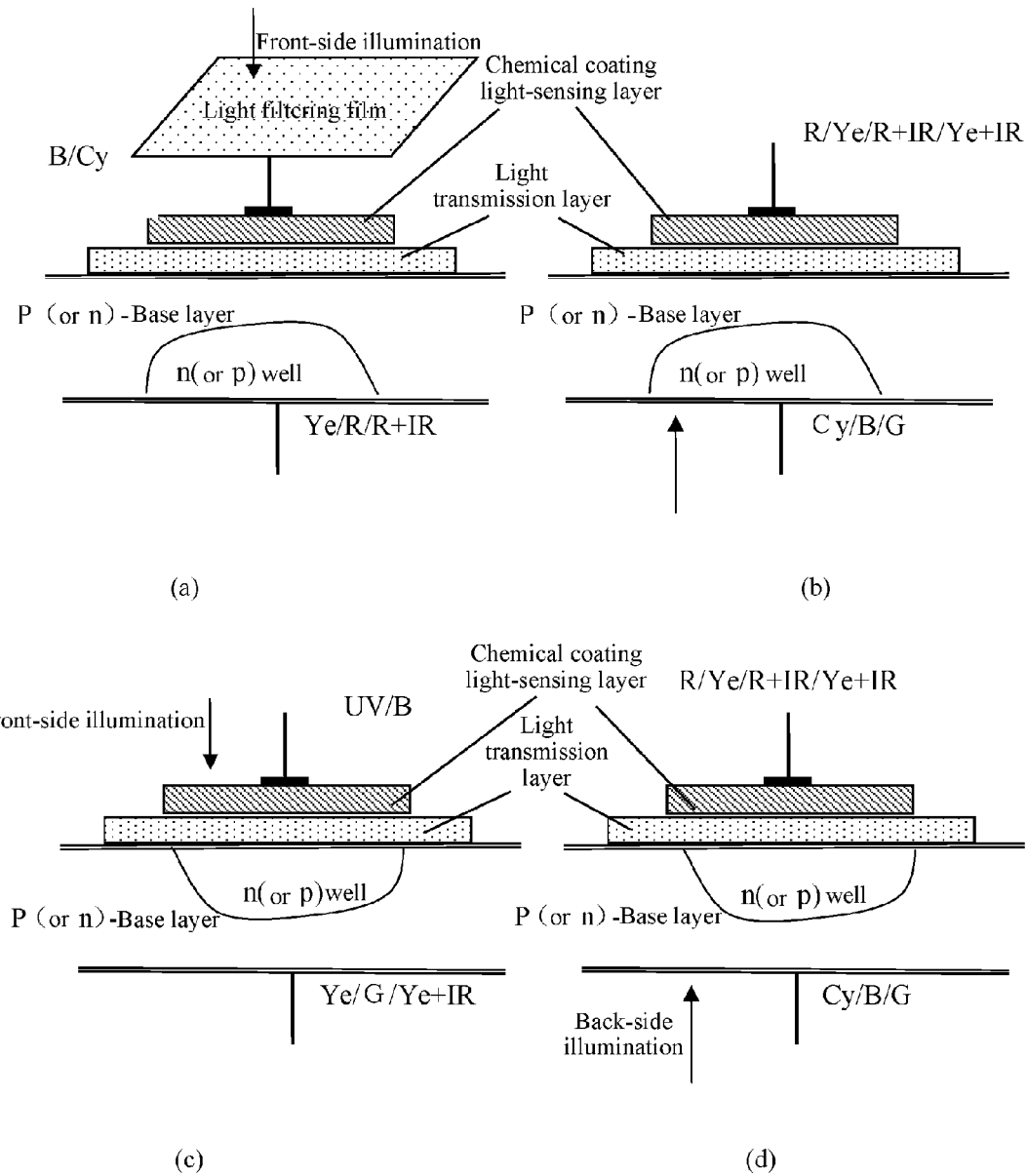
FIG. 16 (a), FIG. 16 (b), FIG. 16 (c), and FIG. 16 (d) are schematic principle diagrams of implementing another light-sensing pixel grade of the multi-depth-of-field light-sensing device shown in FIG. 11, where likewise, by adjusting the thickness of a light transmission layer, the distance between two light-sensing pixel layers can be adjusted, so that light-sensing pixels of the two light-sensing pixel layers are respectively corresponding to different depths of field; in the example, the upper light-sensing pixel layer adopts a chemical coating light-sensing pixel layer, while the lower light-sensing pixel layer adopts a semiconductor light-sensing pixel layer, and evidently the both can be exchanged without affecting the effect of implementing multi-depth-of-field.

FIG. 14 shows a relationship between a wavelength and a focusing plane. For a general optical system, the shorter the wavelength of light is, the shorter the focal distance is, so a lens is designed so that light with a shorter wavelength may be focused to a light-sensing pixel layer closer to the lens; light with a longer wavelength is focused to a light-sensing pixel layer farther away from the lens; light with an intermediate wavelength is focused at an intermediate light-sensing pixel layer. In this way, objects located at different distances always have a color which is distinct in a light-sensing layer. Therefore, this imaging system combines characteristics of multi-spectrum and multi-image-distance simultaneously, and each light-sensing layer has its own depth of field range; for light with different wavelengths, depth of field distances and ranges are different, depth of field ranges of all light-sensing layers can be integrated, the depth of field can be greatly extended, and this imaging system has peerless advantages for macro photography.

A plurality of images having different definitions can be obtained from different light-sensing pixel layers, so reference can be made between these images, and through image integration, selection and abandonment, and mathematical processing such as interpolation, enhancement, or de-convolution, a clear image is obtained.

The implementation manner further includes: implementing a global electronic shutter having a cross-layer reading function in the foregoing multi-depth-of-field light-sensing device, including a plurality of light-stable transfer and reading pixels, and each of the light-stable transfer and reading pixels can be used for transferring and reading a charge or voltage value of at least one light-sensing pixel located at another layer. Thereby the plurality of light-stable transfer and reading pixels may simultaneously transfer and read a charge or voltage value of one or more light-sensing pixel layers. The plurality of light-stable transfer and reading pixels can be located at a same pixel layer with the light-sensing pixels, and evidently, this means decrease of light-sensing sensitivity of the pixel layer. The plurality of light-stable transfer and reading pixels can also be located at a different pixel layer from that of the light-sensing pixels, namely, form an independent light-sensing pixel layer and an independent light-stable transfer and reading pixel layer, and evidently, this means that the global electronic shutter having the cross-layer reading function can only be implemented in a double-layered or multi-layered light-sensing device.

Figure 20:
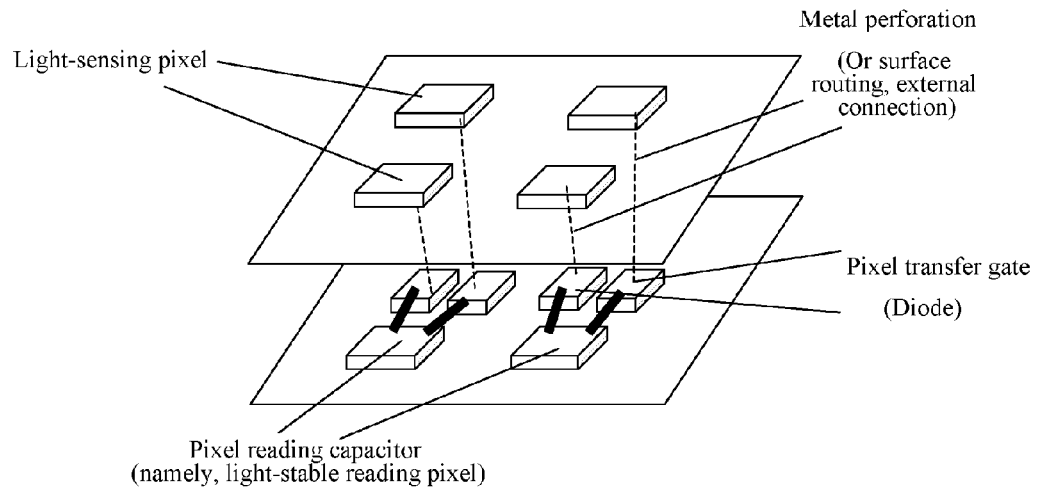
FIG. 20 to FIG. 23 only show a light-sensing pixel layer and a light-stable transfer and reading pixel layer of the light-sensing device with the global electronic shutter (having the cross-layer reading function); evidently, in combination with the above description, when the fixed focus is retained at a plurality of light-sensing pixel layers of different depths of field, a multi-depth-of-field light-sensing device with a global electronic shutter (having a cross-layer reading function) can be obtained.

A proximate corresponding light-stable pixel transfer and reading layer may be disposed for each light-sensing pixel layer, and the light-stable pixel transfer and reading layer may simultaneously transfer charge or voltage values of all pixels of the corresponding light-sensing pixel layer; or may simultaneously transfer charge or voltage values of pixels at rows of odd numbers or rows of even numbers of the corresponding light-sensing pixel layer. FIG. 20 shows design of a reading capacitor of sharing one row of two rows, to implement a line-by-line scanning function. The light-stable transfer and reading pixel layer may be made by a semiconductor circuit.

Figure 17:
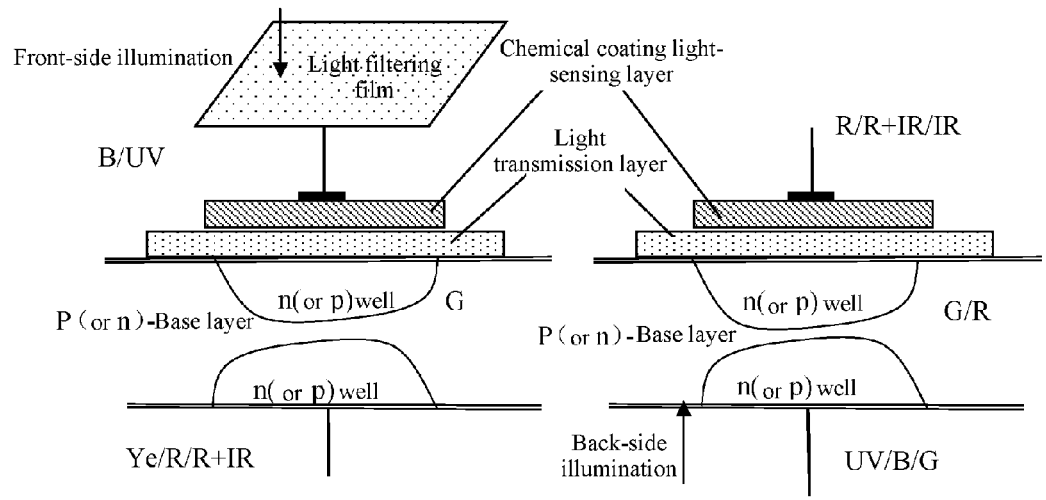
FIG. 17 (a), FIG. 17 (b), FIG. 17 (c), and FIG. 17 (d) are schematic principle diagrams of implementing another light-sensing pixel grade of the multi-depth-of-field light-sensing device shown in FIG. 11, where likewise, by adjusting the thickness of a light transmission layer, the distance between an upper light-sensing pixel layer and another two lower light-sensing pixel layers can be adjusted, so that light-sensing pixels of different light-sensing pixel layers are respectively corresponding to different depths of field; in the example, an upper light-sensing pixel layer adopts a chemical coating light-sensing pixel layer, and another two lower light-sensing pixel layers adopt semiconductor light-sensing pixel layers; it is noted that, two semiconductor light-sensing pixel layers in FIG. 17 (a) and FIG. 17 (b) are arranged at two faces of a semiconductor base layer, and two semiconductor light-sensing pixel layers in FIG. 17 (c) and FIG. 17 (d) are arranged at a face of a semiconductor base layer; an illumination direction can be at a front-side or back-side of the semiconductor base layer; furthermore, it should be noted that, because of light transmission limitation of semiconductor, the thickness of the semiconductor base layer is generally small, and generally does not satisfy the demand of an interval distance between light-sensing pixel layers required by depth of field extension; therefore, two semiconductor light-sensing pixel layers are more frequently used for implementing multi-spectrum demands.
Figure 17:
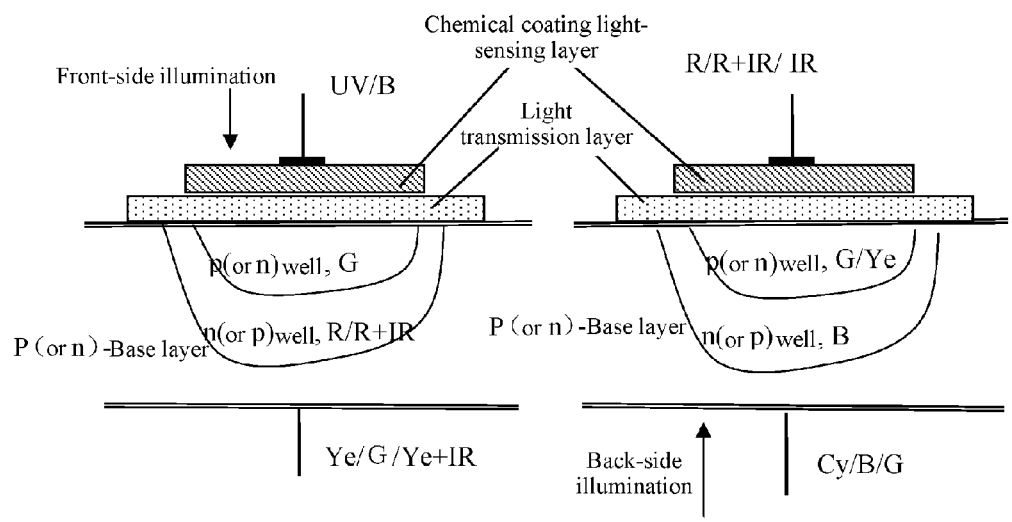
Figure 18:
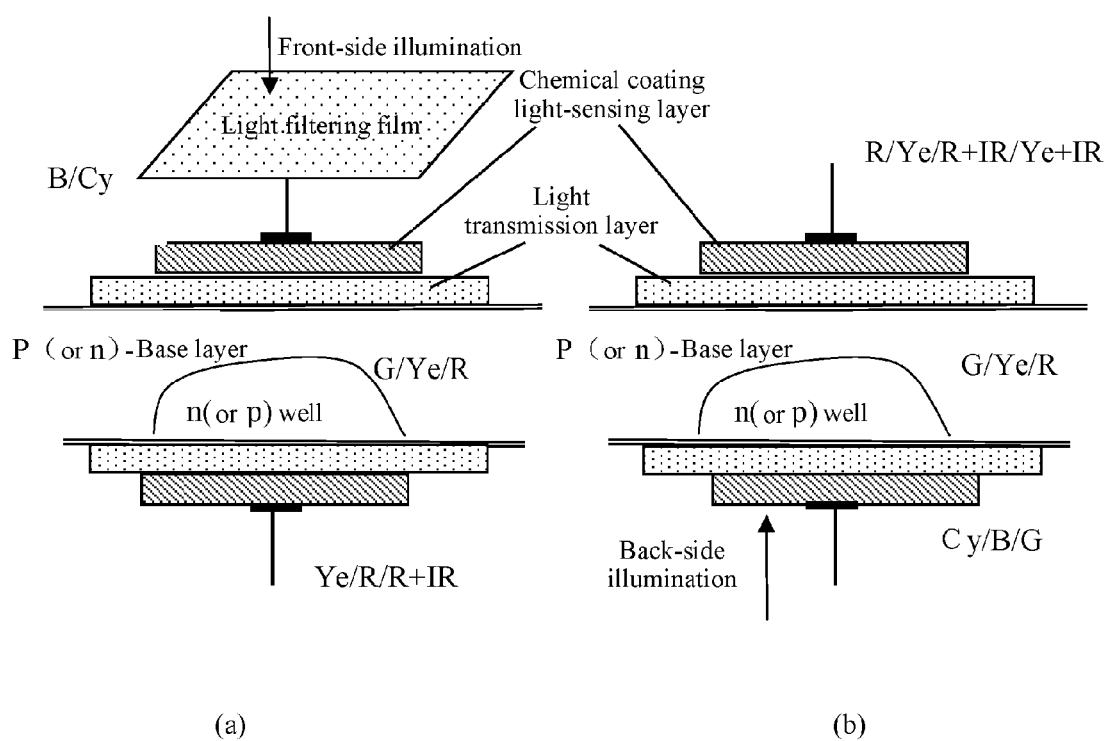
FIG. 18 (a) and FIG. 18 (b) are schematic principle diagrams of implementing another light-sensing pixel grade of the multi-depth-of-field light-sensing device shown in FIG. 11, where likewise, by adjusting the thickness of a light transmission layer, the distance between an upper light-sensing pixel layer and another two lower light-sensing pixel layers can be adjusted, so that light-sensing pixels of different light-sensing pixel layers are respectively corresponding to different depths of field; in the example, an upper light-sensing pixel layer adopts a chemical coating light-sensing pixel layer, and another two lower light-sensing pixel layers each adopt a semiconductor light-sensing pixel layer and a chemical coating light-sensing pixel layer; (two faces of) the intermediate semiconductor light-sensing pixel layer can include a pixel reading and sampling circuit necessary for reading three light-sensing pixel layers.
Figure 19:
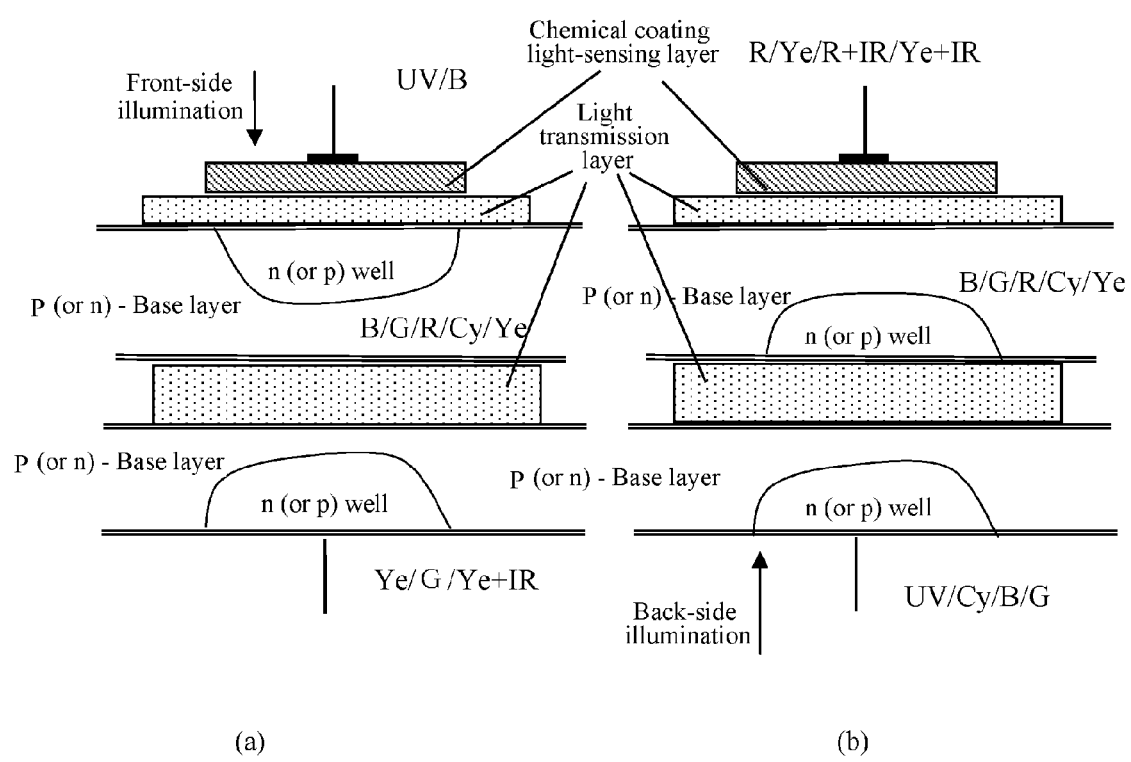
FIG. 19 (a) and FIG. 19 (b) are schematic principle diagrams of implementing a light-sensing pixel grade of the multi-depth-of-field light-sensing device shown in FIG. 12, where it is noted that, in the example, a chemical coating light-sensing pixel layer, a first light transmission layer, a first semiconductor light-sensing pixel layer, a second light transmission layer, and a second semiconductor light-sensing pixel layer are arranged sequentially from top to bottom; the first semiconductor light-sensing pixel layer and the second semiconductor light-sensing pixel layer are implemented on two different semiconductor base layers, the distance between the chemical coating light-sensing pixel layer and the first semiconductor light-sensing pixel layer is implemented by adjusting the thickness of the first light transmission layer, and the distance between the first semiconductor light-sensing pixel layer and the second semiconductor light-sensing pixel layer is implemented by adjusting the thickness of the second light transmission layer; the reading and sampling circuit can be implemented on the intermediate first semiconductor light-sensing pixel layer, or can also be distributed on two semiconductor light-sensing pixel layers.
Figure 21:
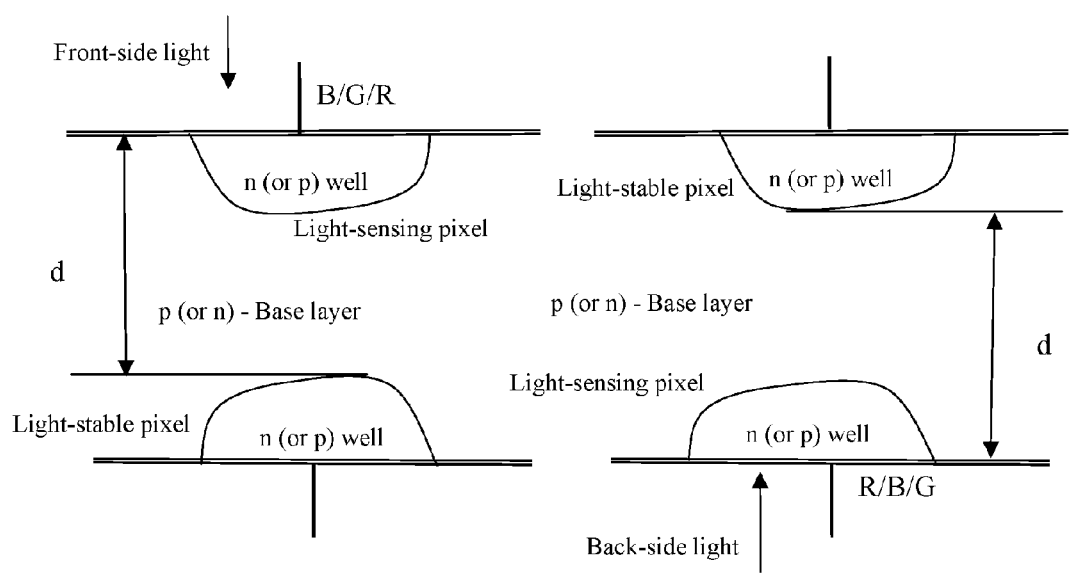

FIG. 21 shows degeneration implementation of a double-layered light-sensing device, to obtain a single-layered light-sensing device with a global electronic shutter. This method utilizes bad light transmission performance of a semiconductor material, and two semiconductor base layers are thickened, so that the bottom layer does not sense light, and can only be used for pixel reading. When this method is used for the three-layered light-sensing device shown in FIG. 17 (*a*), a double-layered multi-depth-of-field light-sensing device with a global electronic shutter can be obtained.

Figure 22:
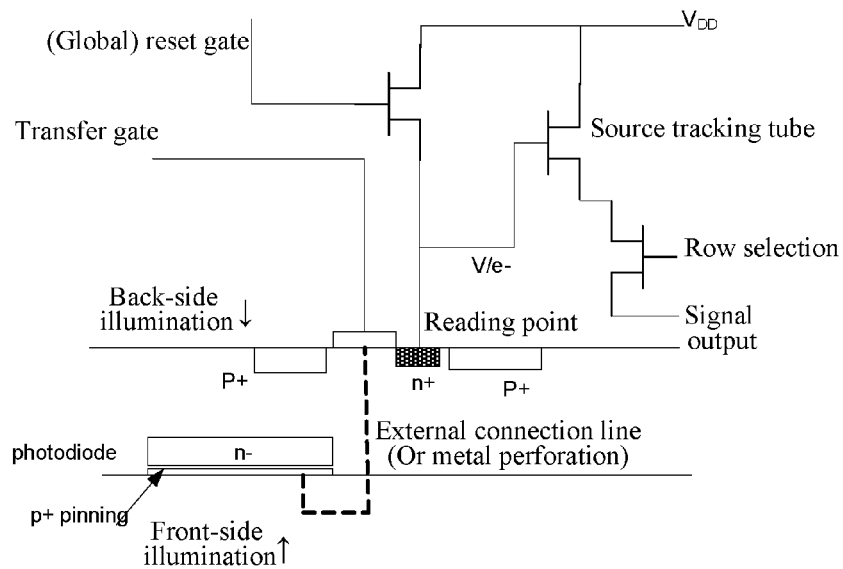
Figure 23:
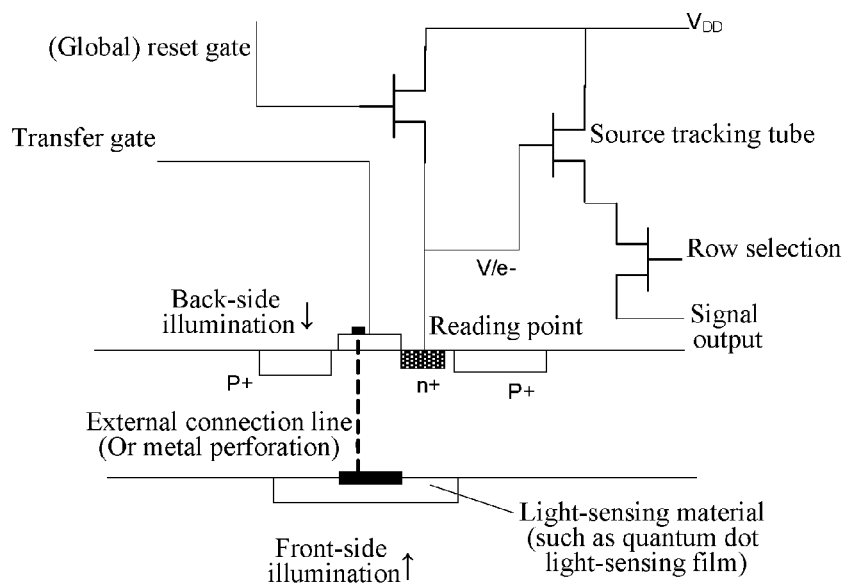
Figure 24:
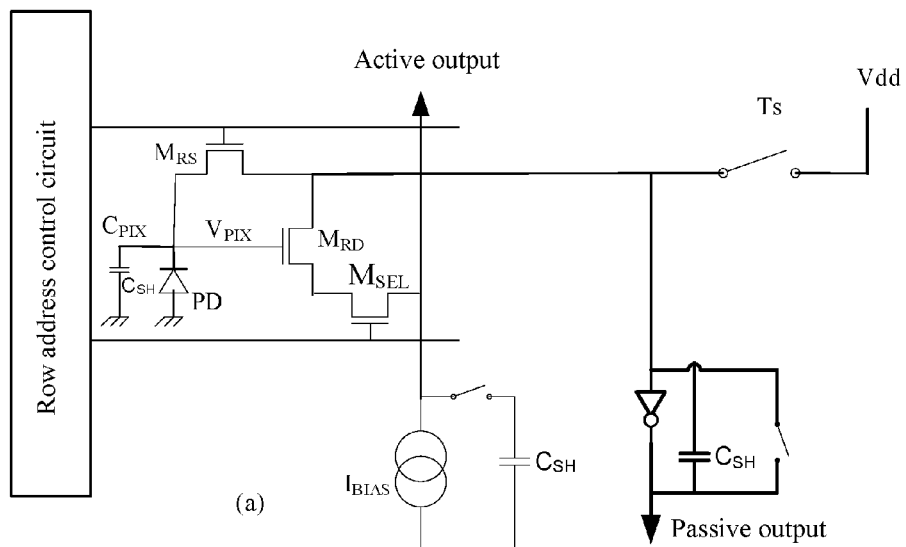
FIG. 24 shows a reading circuit for reading a signal of a light-sensing pixel by use of an active pixel and a passive pixel simultaneously proposed by the inventor in "light-sensing device and reading method for same, and reading circuit" (Chinese Application No: 200910106477.7), where benefits of adoption of this method are in that the dynamic range of a light-sensing device can be greatly expanded, and power consumption during image preview is saved exponentially; this mixed reading circuit is particularly useful in a multi-layered multi-spectrum light-sensing device with high sensitivity and a multi-spectrum light-sensing device with a global electronic shutter.

FIG. 22 and FIG. 23 show implementation of a pixel grade of a global electronic shutter having a cross-layer reading function.

Location relationships such as far, close, upper and lower occurring in the text all refer to relative locations with a light source as the reference. For example, description about the upper light-sensing pixel layer and the lower light-sensing pixel layer refers to that the light-sensing pixel layer is horizontally placed, and the light source vertically illuminates to the light-sensing pixel layer from the top. Obviously, the up-and-down relationship in this text actually has a wider meaning, namely, if the light-sensing face is vertically placed, and the light source vertically illuminates the light-sensing face from the left side or right side, or from the front side or back side, the so-called up-and-down relationship is equivalent to a front-and-back relationship or left-and-right relationship. Without loss of generality, a person skilled in the art can understand that, description about the upper side and the lower side therein can be equivalently replaced with description about the left side, the right side, the front side, and the back side. For different types of light-sensing pixel layers, such as a chemical coating light-sensing pixel layer or semiconductor light-sensing pixel layer, the up-and-down relationship between the chemical coating light-sensing pixel layer and the semiconductor light-sensing pixel layer is not limited, and which one is located above, and which one is located below can be randomly disposed according to needs. The top and the bottom of the base layer described in the following likewise represent a similar meaning, namely, be horizontally placed, and the light source vertically illuminates to the base layer from the top. At this time, a surface of the base layer located above is referred to as the top, and a surface of the base layer located below is referred to as the bottom. It can be understood that, when the base layer is vertically placed, and the light source vertically illuminates to the base layer from the left side or right side, or from the front side or back side, it may be equivalently replaced with depiction of the front side face and the back side face, and the left side face and the right side face.

Furthermore, the difference between the term "capable of inducing a light source" and "light-sensing" also needs to be particularly noted, "light-sensing" of a light-sensing pixel layer refers to that the pixel has a light-sensing capability, and "capable of inducing a light source" refers to a result about whether a light-sensing pixel is capable of inducing a light source, namely, whether the light-sensing capability of the light-sensing pixel is brought into play. For example, because of light transmission performance limitation of semiconductor, when the top and the bottom of a semiconductor base layer are each arranged with a semiconductor light-sensing pixel layer, if the thickness of the semiconductor base layer exceeds the light transmission performance limitation of semiconductor, when the light source illuminates to the semiconductor base layer, only the top semiconductor light-sensing pixel layer is capable of inducing the light source, while the bottom semiconductor light-sensing pixel layer cannot induce the light source due to the limitation of the thickness of the semiconductor base layer, the top semiconductor light-sensing pixel layer is called a light-sensing pixel layer capable of inducing the light source, namely, the light-sensing capability of the light-sensing pixel is brought into play; the bottom semiconductor light-sensing pixel layer is called a light-sensing pixel layer incapable of inducing the light source, namely, the light-sensing capability of the light-sensing pixel cannot be brought into play. It is noted that in the following text, by use of the light-sensing pixel layer incapable of inducing the light source, a light-stable transfer and reading pixel layer can be formed.

Figure 8:
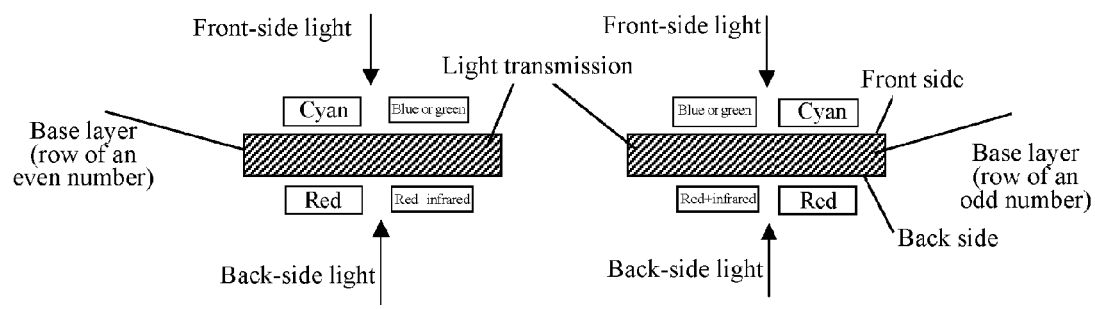
FIG. 8 is a schematic diagram of a double-layered light-sensing device whose light-sensing pixels of an upper layer and a lower layer are complementary or orthogonal on an interested spectrum proposed by the inventor in "multi-spectrum light-sensing device and manufacturing method for same" (Chinese Application No: 200810217270.2) and "multi-spectrum light-sensing device" (Chinese Application No: 200910105372.X), where enormous excellent double-layered light-sensing devices can be obtained by use of elaborately selected color patterns and arrangements; these light-sensing devices can be used for front-side light-sensing, back-side light-sensing, and bidirectional light-sensing; these methods and principles are also applicable to a multi-spectrum light-sensing device of the present invention likewise.

When the chemical coating light-sensing pixel or the semiconductor light-sensing pixel is a bidirectional light-sensing pixel, the problem of selecting a direction by light-sensing is concerned, namely, the chemical coating light-sensing pixel or the semiconductor light-sensing pixel can sense light in a bidirectional manner, but the chemical coating light-sensing pixel or the semiconductor light-sensing pixel cannot accept light illumination in two directions at a same moment, and it is required to select light source illumination in a direction at a moment; a manner of selection of a direction by light-sensing can be selection of a direction by isolation, selection of a direction by time division, selection of a direction by area division, or selection of a direction by a pixel, that is to say, selection of a direction by light-sensing according to a moment, according to an area, and according to a pixel can be implemented in a manner of, such as, blocking by use of a light blocking film. The situation of the bidirectional illumination is shown in FIG. 8.

The light-sensing pixel layer is roughly equivalent to a light-sensing plane vertical to the illumination direction of the light source, such a light-sensing plane is provided with a plurality of light-sensing pixels (generally formed into a multi-row multi-column pixel array), and each light-sensing pixel layer of a plurality of light-sensing pixel layers may be in a planar mixed-type, that is, not only provided with a chemical coating light-sensing pixel, but also provided with a semiconductor light-sensing pixel. In another situation, only a light-sensing pixel is arranged in a same light-sensing pixel layer, and in this way, a chemical coating light-sensing pixel layer, or a semiconductor light-sensing pixel layer is formed.

In an implementation manner, light-sensing pixels of the light-sensing device at a same location (namely, a location where light penetrating from the pixel location of a light-sensing pixel layer is illuminated onto another light-sensing pixel layer) but different layers each induce a complementary band or sub-band of ultraviolet, visible light, near-infrared, and far-infrared; or each induce an orthogonal band or a sub-band of ultraviolet, visible light, near-infrared, and far-infrared. The complementary band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum; and the orthogonal band or sub-band includes ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

The implementation manner includes a band enabling at least one layer in the light-sensing device to induce two different spectrums (namely, radio frequency). The color arrangement of a pixel array for each light-sensing pixel layer includes same arrangement (colors of pixels in the pixel array are the same), horizontal arrangement (colors of pixels in the pixel array in a same row are the same), vertical arrangement (colors of pixels in the pixel array in a same column are the same), diagonal arrangement (colors of pixels in the pixel array on a same diagonal are the same), generalized Bayesian arrangement (colors of pixels in the pixel array on a diagonal are the same, and colors of pixels in the pixel array on the other diagonal are different), YUV422 arrangement, transverse YUV422 arrangement, honeycomb arrangement, and uniform arrangement (four pixels are arranged in a uniform, staggered and equidistant manner).

It should be noted that, the term "arrangement" in this text includes various manufacturing techniques for forming a chemical coating light-sensing pixel layer or semiconductor light-sensing pixel layer on a semiconductor base layer or light transmission layer. For example, the semiconductor base layer is an N-type silicon crystal substrate, at a pixel location on a face of the substrate, according to a color depth demand, P impurities are imbedded from the surface at the pixel location to the inside of the substrate by a certain depth, to form a P doped layer, and the P doped layer is formed into a semiconductor pixel; if N impurities are imbedded at the P doped layer by another certain depth, to form an N doped layer in the P doped layer, and the N doped layer is formed into another semiconductor light-sensing pixel (located at a light-sensing pixel layer different from that at which the semiconductor light-sensing pixel of the previous P doped layer is located, but their pixel locations are corresponding); layered lines can be disposed nearby 390 nm, nearby 500 nm, nearby 610 nm, and nearby 760 nm according to the method provided in "multi-spectrum light-sensing device and manufacturing method for same" (PCT/CN2007/071262), so that pixels at corresponding points above and below any one layered line induce complementary or orthogonal spectrums. FIG. 1 gives an example of disposition of a layered line, namely, different colors are formed by doping impurities at different depths. The face of the substrate is daubed and machined with a chemical coating solution, and a chemical coating light-sensing pixel layer can be formed. Because of diversity of manufacturing or machining techniques, depiction is made with "arrangement" in this text.

The foregoing double-layered semiconductor light-sensing pixel is arranged at different depths, so that a same pixel location on a surface of the substrate can induce at least two bands, thereby providing pixel pattern arrangements on the surface with better flexibility and more pixel arrangements, the sensitivity, the resolution, and the dynamic range of the light-sensing device can be greatly improved.

For the foregoing doping and machining on a face of the semiconductor substrate at different depths, two layers of light-sensing pixels are at most arranged at a same location thereof, the reason is that because if three layers of light-sensing pixels are arranged at a same location, the machining difficulty is great, and simultaneously, for the wire arrangement, because leads between layers need to be isolated from each other, three layers of leads evidently cause the wire arrangement difficult. However, in the present invention, color reconstruction is completed by at most arranging two layers of the foregoing semiconductor light-sensing pixel layers on a same face in combination with the pixel pattern arrangement on a plane, so better color light-sensing performance can be achieved. At most two semiconductor light-sensing pixel layers are arranged on a same face in a depth doping manner, so the difficulty of the three-dimensional machining technique is obviously reduced, and the wire arrangement is also relatively simple.

For the substrate, a single-sided or double-sided machining technique can be adopted, thereby forming a single-sided light-sensing device or double-sided light-sensing device. In the double-sided light-sensing device, for the foregoing depth doping machining, if a double-sided arrangement manner where one of two semiconductor light-sensing pixel layers is arranged on the top of the substrate, and the other thereof is arranged on the bottom of the substrate is adopted, for each face, the machining technique is simplified into a plane machining technique, after plane machining on a light-sensing pixel layer is completed on a face, the substrate is overturned, and on another face likewise, machining on another light-sensing pixel layer is completed with a plane machining technique, so that the machining technique is similar to the existing machining technique for a single-sided single-layered light-sensing device, and is simpler relative to the foregoing three-dimensional machining for double-layered doping on a same face. In another aspect, multiple layers of light-sensing pixels can be arranged at a location of the substrate along the light illumination direction.

The semiconductor light-sensing pixel layer is generally manufactured on the semiconductor base layer, and in order to implement depth of field extension, in actual manufacturing, generally a light transmission layer (such as transparent glass layer) is added to adjust the distance between different light-sensing pixel layers. For example, one or more semiconductor light-sensing pixel layers are manufactured on a semiconductor base layer, then a light transmission layer placed on the semiconductor base layer, and then, a chemical coating light-sensing pixel layer is daubed and machined on the light transmission layer. Different thicknesses of the light transmission layer are set, which is equivalent to preset an interval distance between a chemical coating light-sensing pixel layer and a semiconductor light-sensing pixel layer, thereby implementing depth of field extension.

In many applications, the front side, the back side, or the two sides of the chemical coating light-sensing pixel layer or semiconductor light-sensing pixel layer is not coated with any light filtering film. However, in some other applications, such as a professional camera or camcorder with a particularly high color restoration requirement, the implementation manner includes a manner of using a light filtering film. A light filtering film is disposed on a front side, a back side, or two sides of all or part of light-sensing pixels in the chemical coating light-sensing pixel layer or semiconductor light-sensing pixel layer. Frequency selection characteristics of the light filtering film include infrared cut-off filtering, blue band-pass, green band-pass, red band-pass, cyan band-pass, yellow band-pass, pinkish red band-pass, or visible light band-pass. The light filtering film is used to: by sacrificing sensitivity of a minority of pixels, remove affects of undesired spectrums, reduce crosstalk between upper, lower, left and right pixels, or obtain signals of three-primary colors with better orthogonality or purer complementary colors.

The implementation manner includes: enabling two neighboring layers of multiple light-sensing pixel layers of the multi-depth-of-field light-sensing device to use their respective reading circuits.

The implementation manner includes: enabling two neighboring layers of multiple light-sensing pixel layers of the multi-depth-of-field light-sensing device to share a reading circuit placed at one of the two neighboring layers.

The implementation manner includes: enabling a reading circuit of the multi-depth-of-field light-sensing device to be located at a semiconductor light-sensing pixel layer, or at an independent reading circuit layer.

The implementation manner for a reading circuit of the multi-depth-of-field light-sensing device includes: adopting a pixel reading and sub-sampling method in "multi-spectrum light-sensing device and sampling method for same" (Chinese Application No: 200910105948.2) and "light-sensing device and reading method for same, and reading circuit" (Chinese Application No: 200910106477.7).

The implementation manner includes: adopting a reading circuit for an active pixel, a reading circuit for a passive pixel, or a mixed reading circuit for an active pixel and a passive pixel in a signal reading circuit of the multi-depth-of-field light-sensing device.

Figure 2:
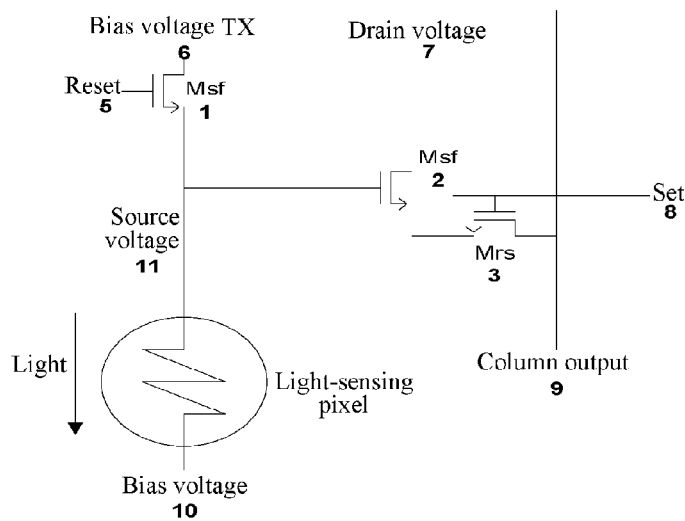
FIG. 2 shows a 3T reading circuit for a light-sensing pixel.
Figure 3:
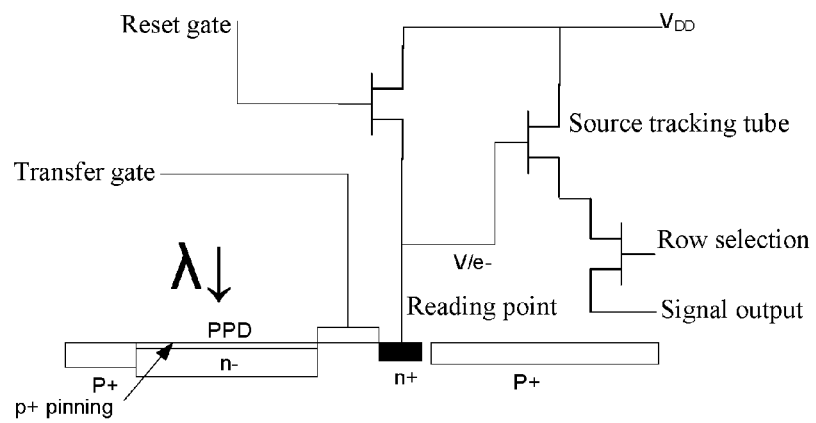
FIG. 3 shows a 4T reading circuit for a light-sensing pixel.
Figure 4:
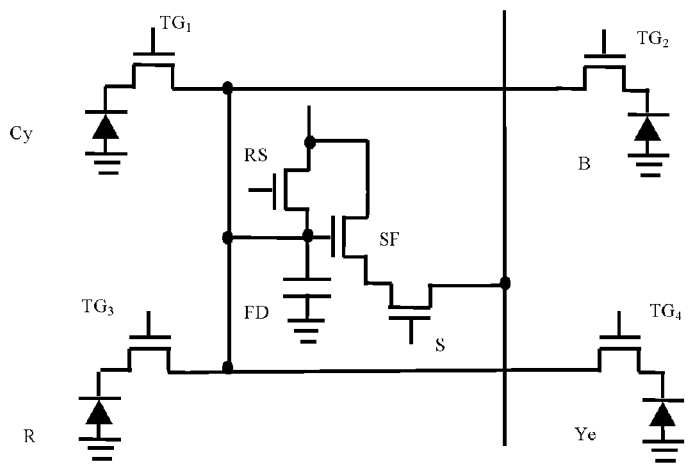
FIG. 4 shows a four-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7)
Figure 5:
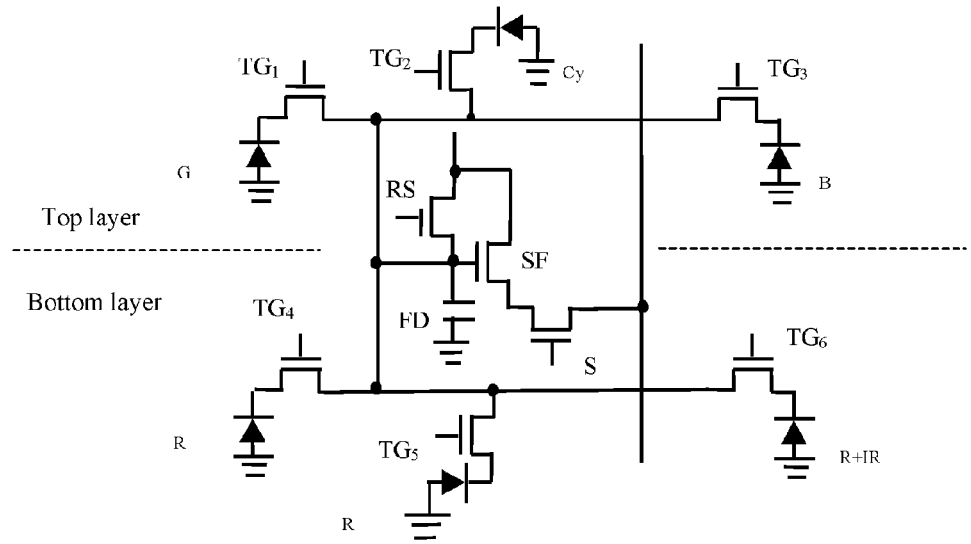
FIG. 5 shows a double-layered six-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7)
Figure 6:
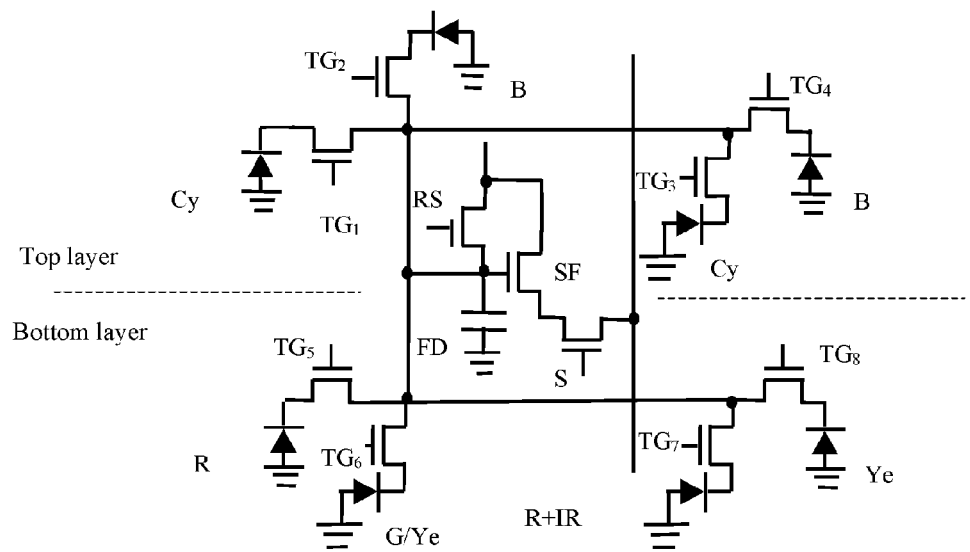
FIG. 6 shows a double-layered eight-point sharing reading circuit proposed by the inventor in "multi-spectrum light-sensing device and sampling method for same" (Chinese Application No: 200910105948.2) and "light-sensing device and reading method for same, and reading circuit" (Chinese Application No: 200910106477.7)
Figure 7:
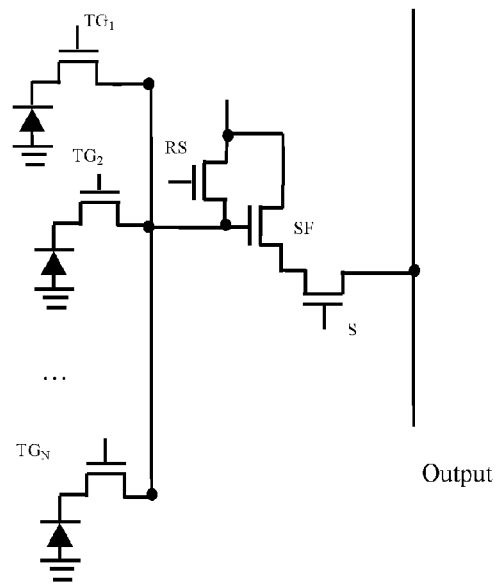
FIG. 7 shows an N-point (where N is a random number) sharing reading circuit proposed by the inventor in "light-sensing device and reading method for same, and reading circuit" (Chinese Application No: 200910106477.7)

The active pixel includes an active pixel 3T, 4T, 5T or 6T. The structure of the active pixel 3T and the structure of the active pixel 4T are respectively shown in FIG. 2 and FIG. 3.

The sharing manner of the reading circuit includes a no-sharing manner, a single-layered or upper-and-lower-layer 4-point sharing manner, a single-layered or upper-and-lower-layer 6-point sharing manner, a single-layered or upper-and-lower-layer 8-point sharing manner, or a single-layered or upper-and-lower-layer any-number-of-point sharing manner.

The 4-point sharing manner, the 6-point sharing manner, the 8-point sharing manner, and the any-number-of-point sharing manner are respectively shown in FIG. 4, FIG. 5, FIG. 6, and FIG. 7.

In an implementation manner, the reading circuit of the multi-depth-of-field light-sensing device includes a first combining unit configured to perform pair-wise combining and sampling on proximate same-row different-column, different-row same-column, or different-row different-column pixels in a pixel array of each light-sensing pixel layer, to obtain sampling data of a first combining pixel; and a second combining unit configured to perform combining and sampling on the sampling data of the first combining pixel obtained by the first combining unit to obtain sampling data of a second combining pixel.

The implementation manner further includes that: the reading circuit further includes a third combining unit, configured to perform combining and sampling on the sampling data of the second combining pixel obtained by the second combining unit to obtain sampling data of a third combining pixel.

In an embodiment of the present invention, in the light-sensing device, a pixel combining manner of the first combining unit or the second combining unit is a charge addition manner between same or different color pixels, where the pixel combining manner between different color pixels conforms to a manner of color space conversion, so as to satisfy a color reconstruction requirement.

The foregoing first combining pixel and second combining pixel are derived from processing of at least dividing sub-sampling into two procedures, namely, a first combining and sampling procedure and a second combining and sampling procedure. The first combining and sampling procedure and the second combining and sampling procedure generally occur between pixel row (combining) sampling and column (combining) sampling, are mainly performed on an analog signal, and except that the charge addition part is only performed in the first combining and sampling procedure generally, the sequence and content thereof generally can be exchanged. Furthermore, a third combining and sampling procedure can also be included, and the third combining and sampling procedure occurs after analog-to-digital conversion, and is mainly performed on a digital signal.

For the first combining and sampling procedure, two proximate pixels in the pixel array are taken and combined. In an aspect, combination of the proximate pixels is completed, and pixels after being combined are referred to as a first combining pixel. It should be understood that, the first combining pixel is only for the convenience of describing the present invention, the concept is utilized to refer to the pixel after the first combining procedure, which does not represents that, a "first combining pixel" exists in the pixel array physically; data obtained after the two proximate pixels are combined and sampled is referred to as sampling data of the first combining pixel. Being proximate refers to that two pixels are tightly adjacent between each other when seen from a horizontal, vertical, or diagonal direction, and no other pixel exists between the two pixels. The proximate situation includes same-row different-column, different-row same-column, or different-row different-column. Generally, in this combination, a signal at least is a signal average of two pixels, while noise is reduced by a multiple of $\sqrt{N}$, so after the combination, the signal-to-noise ratio can at least be increased by a multiple of $\sqrt{N}$, and this combination can be performed between pixels in a same color or different colors. In another aspect, two combining colors can be different, namely, colors are added or averaged, so it may be known from the three primary-color principle of colors that, addition of two primary colors is a complementary color of another primary color, that is to say, pixels in two different primary colors are combined to generate a complementary color of another primary color, a primary-color space is converted into a complementary-color space, color space conversion merely occurs, and color reconstruction can still be completed through different complementary colors. Namely, through this manner, pixels in different colors can be combined to improve the signal-to-noise ratio, and simultaneously color reconstruction can also be performed. The entire sub-sampling procedure is also therefore optimized, so as to be more adaptive to high-speed demands of a pixel array of a large data amount. A basic requirement of the color space conversion is as follows, combination of colors after conversion can reconstruct a required RGB (or YUV, or CYMK) color (through a means such as interpolation).

It should be understood that, generally a pixel array includes a plurality of pixels, and the first combining and sampling only combines two pixels, so evidently, there is also a plurality of first combining pixels formed through combination. Color combining manners adopted for different first combining pixels can be the same or different. When the first combining is all performed between same colors, it is referred to as a same-color combining manner; when the first combining is all performed between different colors, it is referred to as a different-color combining manner; when part of the first combining is performed between same colors, and part thereof is performed between different colors, it is referred to as a hybrid combining manner; when some surplus colors in a pixel array are abandoned (definitely, abandonment is selective, for example, color reconstruction cannot be affected due to this), such color combining manner is referred to as a manner of selectively abandoning surplus colors.

Evidently, the second combining procedure is an operation performed on a plurality of first combining pixels, and likewise, first combining pixels in the same color can be combined; first combining pixels in different colors can also be combined (definitely, under this situation, it may be caused that even if three primary colors are all added, no color can be reconstructed).

The foregoing same-color combining manner, different-color combining manner, and hybrid combining manner are to perform color based classification on combining and sampling, and additionally, from the perspective of location selection of combining and sampling, combining and sampling manners of the first combining procedure and the second combining procedure include: an automatic average manner for a signal directly output to a bus, a row-skipping or column-skipping manner, and a one-by-one sampling manner, and simultaneous use of two or three of these manners. Except that the charge addition part can be only performed in the first combining and sampling procedure generally, manners of the first combining procedure and the second combining procedure are the same and can be exchanged except that their sequences are different.

The so-called automatic average manner for a signal directly output to a bus is to simultaneously output signals needing to be combined (whose colors are the same or different) to a data collection bus to obtain an average value of the signals needing to be combined through automatic balance of (voltage) signals. The so-called row-skipping or column-skipping manner is to skip some rows or columns, thereby implementing (combining) sampling in a manner of reducing the data amount. The so-called one-by-one sampling manner actually is to perform no combination, and read the original pixel or the first combining pixel accordingly. Some of these three manners can be used simultaneously. For example, the row-skipping or column-skipping manner and the automatic average manner for a signal directly output to a bus or the one-by-one sampling manner may be used simultaneously.

The sub-sampling manner of the third combining and sampling procedure includes a color space conversion manner, a backend digital image zoom manner, and serial use of these two manners. The first combining procedure and the second combining procedure are mainly performed on an analog signal, while the third sub-sampling procedure is mainly performed on a digital signal, namely, performed after analog-to-digital conversion. Three or four color pixels located at different space locations as values on a same point are converted into another color space, and data may be reduced in the horizontal and (or) vertical directions, thereby achieving the sub-sampling effect. However, the digital image zoom manner is the most straightforward and frequently-used sub-sampling manner.

Charges can be added during combining and sampling. The current combining and sampling almost only achieve averaging of voltage or current signals, and when N points are combined, this manner at most can only increase the signal-to-noise ratio by a multiple of $\sqrt{N}$. The reason lies in that the existing combining and sampling are to perform combining and sampling in a manner where N pixels in the same color share an output line, and on this output line, voltage or current signals of each pixel are inevitably (automatically) averaged, so the increase of the signal-to-noise ratio only lies in that the noise is reduced by a multiple of $\sqrt{N}$ after the combination, thereby increasing the signal-to-noise ratio at most by a multiple of $\sqrt{N}$. However, by means of the charge addition manner of the present invention, for example, a reading capacitor stores charges, to accumulate the charges, so that signals can be superimposed and therefore the signal-to-noise ratio can be increased at least by a multiple of N, which is higher than the signal averaging method at least by a multiple of $\sqrt{N}$. That is to say, N signals are combined with the charge addition method, and an effect of averaging $N^2$ signals at most theoretically or a better effect (as described below) can be achieved, which is a means of increasing the signal-to-noise ratio whose effect is very prominent.

Addition of proximate pixels further brings another prominent effect, that is, the effect of cross-talking between pixels is weakened. The reason lies in that, colors originally interfering with each other is a legal whole now, that is to say, a part of signals which originally belong to noise becomes an effective signal part now, so addition of charges of N signals increases the signal-to-noise ratio, which can approximate to the theoretical upper limit, namely, a multiple of $N\sqrt{N}$, which is thereby equivalent to an effect of averaging $N^3$ signals.

During total-graph sampling (namely, an image is sampled according to the highest resolution), a line-by-line scanning and interleaving or cross-line reading manner can be adopted, the clock speed does not need to be increased, no frame buffer needs to be adopted, and the total-graph frame reading rate of a large-array image is doubled when a single picture is shot. If an AD converter and a row buffer are added, the total-graph frame reading rate can further be increased. This method has a very important value for leaving out a mechanical shutter.

It is noted that, the line-by-line scanning and interleaving or cross-line reading manner of the present invention is different from the field scanning manner (interleaved scanning) in a conventional television system. The conventional field scanning manner is interleaving scanning and interleaving reading, so a field of an odd number and a field of an even number (no matter whether it is light-sensing or reading) are in a difference of a field in the time, namely, half frame. However, in the line-by-line scanning and interleaving or cross-line reading manner of the present invention, a pixel is completely the same as that in the line-by-line scanning and line-by-line reading manner in the light-sensing time sequence, and only the row reading sequence is changed. For detailed description, refer to "multi-spectrum light-sensing device and sampling method for same" (Chinese Application No: 200910105948.2) and "light-sensing device and reading method for same, and reading circuit" (Chinese Application No: 200910106477.7).

Figure 10:
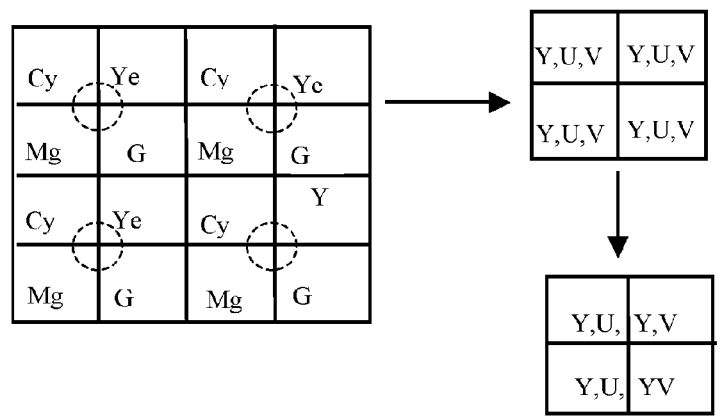
FIG. 10 shows a pixel combining and sub-sampling method implemented by use of color space conversion proposed by the inventor in "multi-spectrum light-sensing device and sampling method for same" (Chinese Application No: 200910105948.2), where this method is applicable to a multi-spectrum light-sensing device of the present invention likewise.
Figure 11:
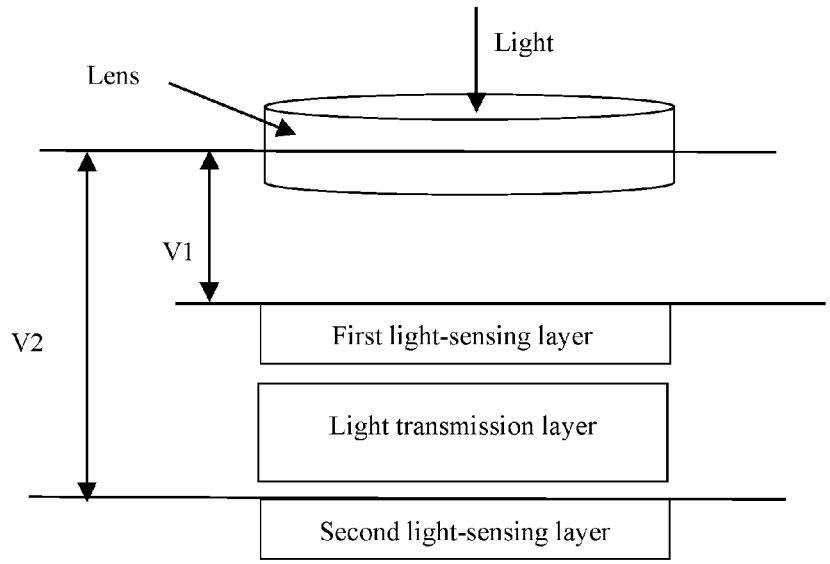
FIG. 11 is a schematic structural diagram of a double-layered light-sensing device for depth of field extension proposed in the present invention, where the thickness of a light transmission layer is decided by a difference between image distances of two desired light-sensing planes (V2-V1)
Figure 12:
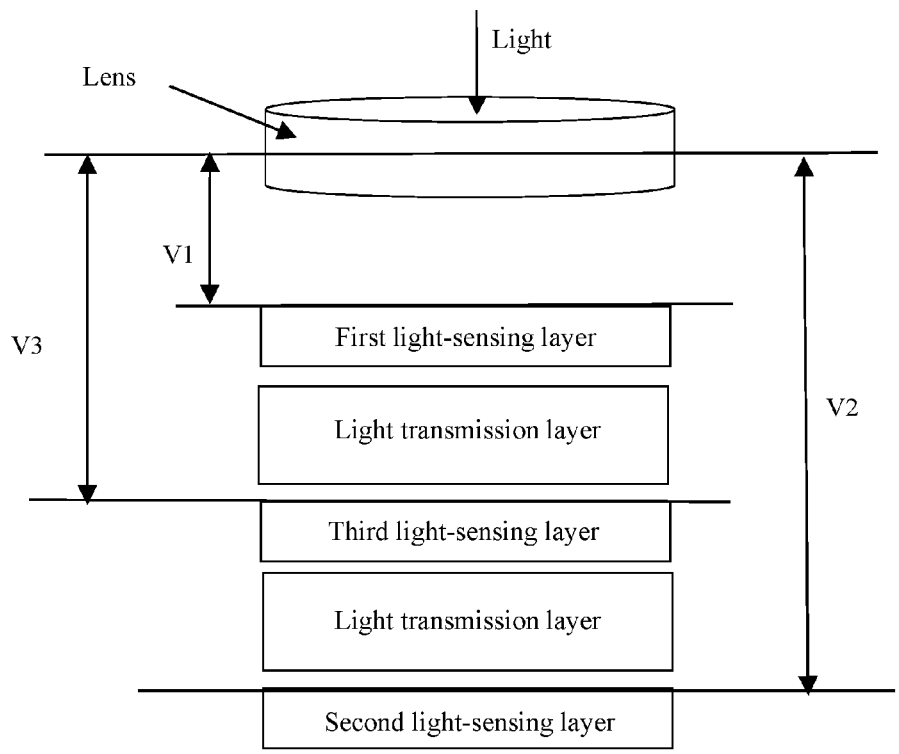
FIG. 12 is a schematic structural diagram of a three-layered light-sensing device for depth of field extension proposed in the present invention, where the thickness of a light transmission layer is decided by a difference between image distances of two desired light-sensing planes (V2-V1 or V3-V2)

In an embodiment of the present invention, in the light-sensing device, the color space conversion includes space conversion from RGB to CyYeMgX, space conversion from RGB to YUV, or space conversion from CyYeMgX to YUV, where X is any one of R (red), G (green), and B (blue). FIG. 10 shows a manner of utilizing color space conversion to implement sub-sampling.

The implementation manner includes that: the charge addition manner is completed by directly connecting pixels in parallel or simultaneously transferring charges into a reading capacitor (FD).

As described above, in the multi-depth-of-field light-sensing device, a color based combining and sampling manner of the first combining unit or the second combining unit includes a same-color combining manner, a different-color combining manner, a hybrid combining manner, or a combining manner of selectively abandoning surplus colors, and the combining and sampling manner adopted by the first combining unit and the combining and sampling manner adopted by the second combining unit are not the same-color combining manner simultaneously, namely, at least one of the two combining units does not adopt the same-color combining manner.

As described above, a location based combining and sampling manner of the first combining unit or the second combining unit includes at least one of the following several manners: an automatic average manner for a signal directly output to a bus, a row-skipping or column-skipping manner, and a one-by-one sampling manner. Namely, these several location based combining and sampling manners can be individually used, or combined and used.

As described above, in the light-sensing device, at least one of the color space conversion manner and the backend digital image zoom manner can be used to implement the combining and sampling manner of the third combining and sampling unit.

Figure 9:
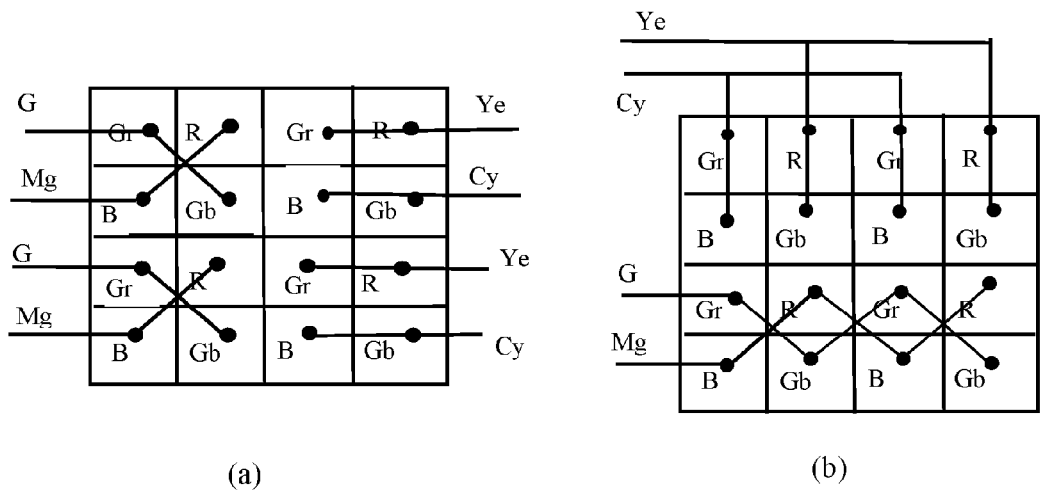
FIG. 9 shows a sub-sampling method for implementing charge combining between different color pixels proposed by the inventor in "multi-spectrum light-sensing device and sampling method for same" (Chinese Application No: 200910105948.2), where this method is applicable to a multi-spectrum light-sensing device of the present invention likewise.

FIG. 9 shows a different-color pixel charge combining manner.

Figure 25:
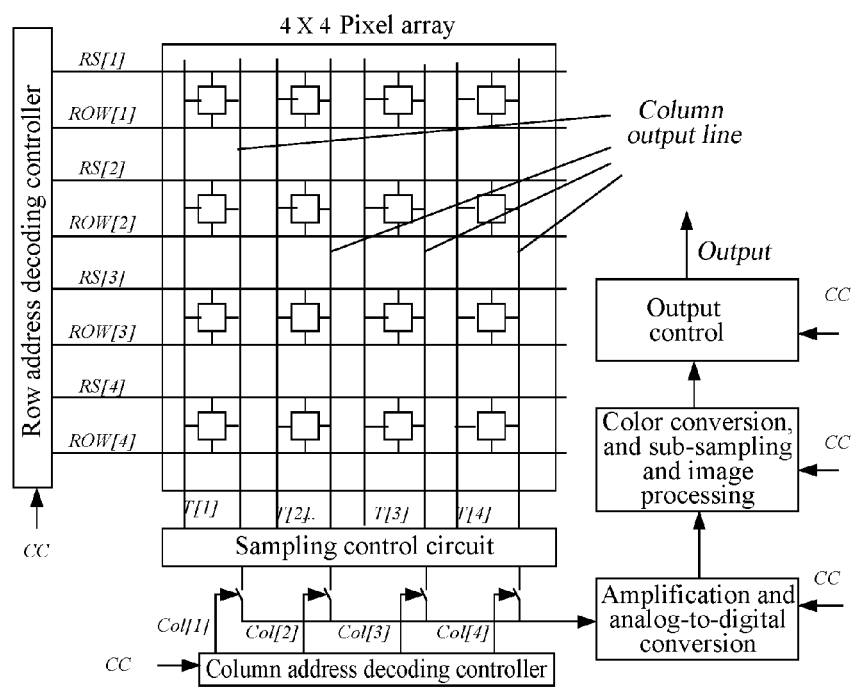
FIG. 25 is a schematic diagram of a sampling control circuit used for describing a pixel combining and sub-sampling method proposed in the present invention in "multi-spectrum light-sensing device and sampling method for same" (Chinese Application No: 200910105948;2), where the present invention also uses this innovative pixel combining and sub-sampling method.

The foregoing sub-sampling function is implemented by a row address decoding controller and a column address decoding controller shown in FIG. 25. The row address decoding controller outputs two types of signals: a row selection signal Row[i] (a line at each row) and a row control vector signal RS[i] (one or more lines at each row), where i is the mark of a row. Similarly, the column address decoding controller outputs two types of signals: a column selection signal Col[j] (a line at each column) and a column control vector signal T[j] (one or more lines at each column), where j is the mark of a column.

The row selection signal Row[i] is used for selecting a row, while the column selection signal Col[j] is used for selecting a column. They are two groups of relatively standard signals. The row control vector signal RS[i] is extension on the existing CMOS row control signal (a line at each row is extended to multiple lines at each row), while the column control vector signal T[j] does not exist in some CMOS light-sensing devices at all, and even if the column control vector signal T[j] exists in a CMOS light-sensing devices, a column only has one column control vector signal.

RS[i] and T[j] are used for controlling reset of a light-sensing pixel, zero clearing, light-sensing time, charge transfer, pixel combining, and pixel reading. Because of symmetry between rows and columns, RS[i] and T[j] have many specific implementation manners. The specific implementation manners of these signals are not limited.

As described above, the total-graph sampling manner of the multi-spectrum light-sensing device includes the line-by-line scanning and line-by-line reading manner, or the line-by-line scanning and interleaving or cross-line reading manner.

The implementation manner further includes: manufacturing a light-sensing system, including the foregoing multi-depth-of-field light-sensing device.

The light-sensing system is configured to obtain a front-side, back-side, or bidirectional image.

The light-sensing system includes a digital camera, a camera mobile phone, a camcorder, a video or camera monitoring system, an image identifying system, a medical image system, a military, fire fighting, and underground image system, an automatic tracking system, a three-dimensional image system, a machine vision system, an automobile vision or driving assistance system, an electronic game system, a network camera, an infrared and night view system, a multi-spectrum imaging system, and a computer camera.

The implementation manner further includes: implementing a depth of field extension method, including steps of: disposing, in a light-sensing device, at least two light-sensing pixel layers capable of inducing a light source, and arranging the at least two light-sensing pixel layers at an interval of a preset distance, so that different light signals from a lens at a specific distance from the light-sensing device are focused to different light-sensing pixel layers.

In the depth of field extension method, a clear image is obtained through images with different definitions and from different light-sensing pixel layers.

The implementation manner further includes an imaging method, or an application of the light-sensing device in imaging, including: disposing a lens and a light-sensing device including at least two light-sensing pixel layers capable of inducing a light source; and placing the light-sensing device at a specific distance from the lens, and arranging the at least two light-sensing pixel layers at an interval of a preset distance, so that different light signals from the lens are focused to the different light-sensing pixel layers.

Referring to FIG. 11 to FIG. 14, an implementation manner further includes an optical imaging system, including: a lens and a multi-depth-of-field light-sensing device, where the multi-depth-of-field light-sensing device is arranged at a specific distance from the lens, and includes at least two light-sensing pixel layers capable of inducing a light source, where the at least two light-sensing pixel layers are arranged at an interval of a preset distance, so that different light signals from a lens at a specific distance from the light-sensing device are focused to different light-sensing pixel layers.

As shown in FIG. 13, light with all interested wavelengths at different distances can be respectively focused to each light-sensing pixel layer; or as shown in FIG. 14, light with different wavelengths at a same distance can be respectively focused to each light-sensing pixel layer; or light with different wavelengths at different distances can be respectively focused to each light-sensing pixel layer.

The implementation manner includes the light focused to each light-sensing pixel layer, and wavelengths thereof are gradually increased from near to far according to the distance between each light-sensing pixel layer and the optical lens.

Alternatively, in each light-sensing pixel layer, a light signal at a farther distance is focused to a light-sensing pixel layer closer to the lens.

For example, when two light-sensing pixel layers capable of inducing the light source are included, the two light-sensing pixel layers are respectively located at a first image distance and a second image distance of the lens, and ultraviolet light, blue light, green light, cyan light, or white light can be focused to a light-sensing pixel layer closest to the lens through optical lens design; correspondingly, blue light, green light, red light, yellow light, or infrared light is focused to a light-sensing pixel layer farthest away from the lens.

For another example, when three light-sensing pixel layers capable of inducing the light source are included, the three light-sensing pixel layers are respectively located at a first image distance, a second image distance and a third image distance of the lens, and ultraviolet light, blue light, green light, or cyan light can be focused to a light-sensing pixel layer closest to the lens through optical lens design; correspondingly, red light, yellow light, visible light, or infrared light is focused to a light-sensing pixel layer farthest away from the lens; correspondingly, green light, yellow light, visible light, or red light is focused to an intermediate light-sensing pixel layer.

For another example, when four light-sensing pixel layers capable of inducing the light source are included, the four light-sensing pixel layers are respectively located at a first image distance, a second image distance, a third image distance and a fourth image distance of the lens, and ultraviolet light, blue light, green light, or cyan light can be focused to a light-sensing pixel layer closest to the lens through optical lens design; correspondingly, red light, yellow light, white light, or infrared light is focused to a light-sensing pixel layer farthest away from the lens; correspondingly, blue light, green light, or cyan light is focused to a light-sensing pixel layer next to the light-sensing pixel layer closest to the lens; correspondingly, green light, red light, white light, or yellow light is focused to a light-sensing pixel layer next to the light-sensing pixel layer farthest away from the lens.

For another example, when two light-sensing pixel layers capable of inducing the light source are included, the two light-sensing pixel layers are respectively located at a first image distance and a second image distance of the lens, and ultraviolet light or visible light can be focused to a light-sensing pixel layer closest to the lens through optical lens design; visible light or infrared light is focused to a light-sensing pixel layer farthest away from the lens.

For another example, when three light-sensing pixel layers capable of inducing the light source are included, the three light-sensing pixel layers are respectively located at a first image distance, a second image distance and a third image distance of the lens, and ultraviolet light or white light can be focused to a light-sensing pixel layer closest to the lens through optical lens design; white light or infrared light is focused to a light-sensing pixel layer farthest away from the lens; white light is focused at an intermediate light-sensing pixel layer.

For another example, when four light-sensing pixel layers capable of inducing the light source are included, the four light-sensing pixel layers are respectively located at a first image distance, a second image distance, a third image distance and a fourth image distance of the lens, and ultraviolet light or white light can be focused to a light-sensing pixel layer closest to the lens through optical lens design; white light or infrared light is focused to a light-sensing pixel layer farthest away from the lens; white light is focused to a light-sensing pixel layer next to the light-sensing pixel layer closest to the lens; white light is focused to a light-sensing pixel layer next to the light-sensing pixel layer farthest away from the lens.

It should be noted that, in the foregoing example, for light including all interested wavelengths, such as white light, if it is illustrated that the white light is focused to different light-sensing pixel layers, the white light is generally derived from different distances. Namely, for example, infinitely far white light is focused a light-sensing pixel layer closest to the lens, and white light at the interested shortest distance is focused to a light-sensing pixel layer farthest away from the lens. Namely, when light signals focused to two light-sensing pixel layers have the same frequency spectrum characteristic, the light signals have to have different distance characteristics.

The multi-depth-of-field light-sensing device of the present invention may simultaneously obtain numerous color signals and other spectrum signals while having excellent characteristics multi-spectrum at the same time. For example, in a four-layered light-sensing device, a first chemical coating light-sensing pixel layer inducing ultraviolet light, a first semiconductor light-sensing pixel layer inducing blue light, green light, or cyan light, a second semiconductor light-sensing pixel layer inducing red light, yellow light, or green light, and a second chemical coating light-sensing pixel layer inducing infrared light may be arranged from near to far from a light source along a light path. The first semiconductor light-sensing pixel layer and the second semiconductor light-sensing pixel layer are respectively implemented on two semiconductor base layers, a light transmission layer with a preset thickness is disposed between the two semiconductor base layers, and the first chemical coating light-sensing pixel layer is arranged above the top of the base layer where the first semiconductor light-sensing pixel layer is located; the second chemical coating light-sensing pixel layer is arranged below the bottom of the base layer where the second semiconductor light-sensing pixel layer is located. Therefore, not only is depth of field extension implemented, but also energy of incident light may be almost maximally utilized; while colors are obtained, information of the full spectrum is also obtained, so as to exploit characteristics of different light-sensing materials to the full. The manufacturing difficulty of such a four-layered multi-spectrum light-sensing device is not too high. If the advanced sampling and the sub-sampling circuit and method prominently characterized by charge combination and color conversion invented by the inventor previously in the above text are combined and adopted, the complexity of the light-sensing device and system can be greatly reduced further, thereby providing enormous convenience and excellent performance to various applications.

In the multi-depth-of-field light-sensing device of the present invention, a first special use which is firstly implemented is depth of field extension, and the existing EDoF implements depth of field extension mainly by use of optical and mathematical means, and generally needs to perform automatic focusing by means of, for example, a lens; in contrast, the present invention implements depth of field extension directly through a physical means of disposing different light-sensing pixel layers in the device at an interval of a preset distance. A second special use which is secondly implemented is to implement a global electronic shutter, and the existing global electronic shutter (Global Shutter) mainly uses a reading circuit means; in contrast, the present invention can implement high-resolution and high-speed photographing by use of light-stable transfer and reading pixels without any mechanical shutter. When these two implementations (namely, depth of field extension and global electronic shutter) are integrated on a same light-sensing device, enormous power of a multi-layered multi-spectrum light-sensing device is fully brought into play. Therefore, the present invention greatly surpasses the existing method in many indexes and performances.

Besides greatly increasing sensitivity, the multi-depth-of-field light-sensing device of the present invention further can greatly increase the depth of field range of a system by means of adjusting distances between different light-sensing pixel layers, so as to make the images more distinct, the system reaction speed faster, and the application range wider, and even eliminate automatic focusing demands in some applications. The multi-depth-of-field light-sensing device of the present invention can rapidly obtain a clear image in its covered depth of field range without need of a focusing procedure. Besides being capable of reducing difficulty and cost of automatic focusing, the depth of field extension can even thoroughly eliminate demands of automatic focusing in some applications such as mobile phone camera, macro photography, or telephotograph. The depth of field extension can further make objects at different distances in a same picture distinct simultaneously, which is also very useful in some special applications, but which cannot be accomplished by automatic focusing, because the existing automatic focusing system can only make an object at a distance be distinctly imaged, but cannot make objects in a very wide range all distinct. Therefore, the depth of field extension of the present invention also still has a very large value in a system having an automatic focusing capability.

Because of high sensitivity of the multi-depth-of-field light-sensing device of the present invention, the light-sensing speed thereof may also be greatly increased, thereby providing a possibility for taking down a mechanical shutter in many applications. Therefore, in the multi-depth-of-field light-sensing device of the present invention, the implementation of a global electronic shutter having a cross-layer reading function is further proposed, in order to replace a possibly required mechanical shutter in some applications. The global electronic shutter functions to copy a charge or voltage value in a light-sensing pixel to a light-stable reading pixel in an instant, so as to be read by a reading circuit in no hurry.

In combination with the implementation of the global electronic shutter for the depth of field extension, when the both are integrated on a light-sensing device, a high-performance, high-speed, and high-resolution light-sensing system without need of the automatic focusing and the mechanical shutter can be implemented in a chip manner, thereby greatly reducing the size, the complexity, the power consumption and the cost of the system, and providing a possibility for many new applications.

This light-sensing device with a global electronic shutter or multi-depth-of-field light-sensing device may leave out a mechanical shutter or leave out an automatic focusing system (or reduce requirements on an automatic focusing system) for a light-sensing system, and implement a high-speed electronic shutter or clear imaging without accelerating the clock of the light-sensing device.

At the same time of greatly simplifying requirements on the mechanical complexity of the light-sensing system, the present invention adopts a double-layered or multi-layered deployment, can maximally utilize energy of incident photons in combination with an advanced method for double-layered or multi-layered complementary or orthogonal color pattern arrangement, and does not use any color light filtering film or only uses a few color light filtering films, thereby achieving or approximately achieving the theoretical upper limit of photoelectric conversion efficiency, and obtaining images of other spectrums, including an ultraviolet image, a near-infrared image, and a far-infrared image while completely reconstructing colors.

After a light-sensing pixel layer and a reading circuit are layered, reading circuit and processing calculation of a reading circuit layer can be made very elaborate and complex, so as to provide enormous convenience for manufacturing of a single-chip light-sensing system.

This multi-depth-of-field light-sensing device may simultaneously obtain numerous color signals and other spectrum signals, and if the advanced sampling and the sub-sampling circuit and method prominently characterized by charge combination and color conversion invented by the inventor previously are adopted, the complexity of the light-sensing device and system can be greatly reduced, thereby providing enormous convenience and excellent performance to various applications.

The multi-depth-of-field light-sensing device can be used for front-side light-sensing, back-side light-sensing, or bidirectional light-sensing. By elaborately arranging a pixel induction spectrum band of a light-sensing device of each layer and reasonable deployment of a color pattern of each layer, various preferable multi-spectrum light-sensing devices can be generated, such as, a high-sensitivity color light-sensing device, a high-sensitivity color and infrared light-sensing device, a high-sensitivity color or multi-spectrum light-sensing device without any mixed color (a mixed color is caused through interpolation), and the like.

By means of a combination of reading of an active pixel and reading of a passive pixel, a light-sensing device with super-low power consumption, and a light-sensing device with a super-high dynamic range can be obtained.

Though the present invention has been disclosed above by the specific embodiments, they are not intended to limit the present invention. Anybody of ordinary skill in the art can make some modifications and variations without departing from the spirit and scope of the present invention. Therefore, the protection scope of the present invention falls within the appended claims.

What is claimed is:

1. A multi-depth-of-field light-sensing device, comprising at least two light-sensing pixel layers capable of inducing a light source,
   wherein different light-sensing pixel layers sense light signals with different wavelength bands that are orthogonal or complementary to each other,
   wherein the at least two light-sensing pixel layers are arranged at an interval of a preset distance, so that light signals from different distances and with different wavelengths are focused to the different light-sensing pixel layers by a lens at a specific distance from the light-sensing device,
   wherein orthogonal bands mean bands that are substantially un-overlapped to each other, and
   wherein complementary bands mean bands that are orthogonal and can be combined to form an integral band.

2. The light-sensing device according to claim 1, wherein the light-sensing pixel layer comprises at least one of a chemical coating light-sensing pixel layer and a semiconductor light-sensing pixel layer,
   wherein the chemical coating light-sensing pixel layer comprises a quantum dot light-sensing pixel; and/or,
   wherein the semiconductor light-sensing pixel layer comprises a component selected from the group consisting of (a) a CMOS light-sensing diode, (b) a CMOS light-sensing gate, (c) a CCD light-sensing diode, (d) a CCD light-sensing gate, and (e) a CMOS and CCD light-sensing diode and light-sensing gate having a bidirectional charge transfer function.

3. The light-sensing device according to claim 1, wherein a light signal with a shorter wavelength is focused to a light-sensing pixel layer closer to the lens.

4. The light-sensing device according to claim 3, wherein the light-sensing pixel layer is double-layered, violet light, blue light, green light, or cyan light is focused to a light-sensing pixel layer closer to the lens, and green light, red light, yellow light, visible light, or infrared light is focused to a light-sensing pixel layer farther away from the lens; or,
wherein the light-sensing pixel layer is three-layered, and ultraviolet light, blue light, or cyan light is focused to a light-sensing pixel layer closest to the lens; blue light, green light, red light, or yellow light is focused to an intermediate light-sensing pixel layer; red light, yellow light, visible light, or infrared light is focused to a light-sensing pixel layer farthest away from the lens.

5. The light-sensing device according to claim 1, wherein a light signal at a farther distance is focused to a light-sensing pixel layer closer to the lens.

6. The light-sensing device according to claim 5, wherein the light-sensing pixel layer is double-layered, an infinitely far light signal is focused to a light-sensing pixel layer closer to the lens, and a light signal at an interested shortest distance is focused to a light-sensing pixel layer farther away from the lens; or,
wherein the light-sensing pixel layer is three-layered, an infinitely far light signal is focused to a light-sensing pixel layer closest to the lens, a light signal at an interested shortest distance is focused to a light-sensing pixel layer farthest away from the lens, and a light signal at an intermediate distance between the infinitely far light signal and the light signal at the interested shortest distance is focused to an intermediate light-sensing pixel layer.

7. The light-sensing device according to claim 6, wherein infinitely far violet light, blue light, green light, or cyan light is focused to a light-sensing pixel layer closer to the lens, and green light, red light, yellow light, visible light, or infrared light at an interested shortest distance is focused to a light-sensing pixel layer farther away from the lens; or,
wherein the light-sensing pixel layer is three-layered, infinitely far ultraviolet light, blue light, or cyan light is focused to a light-sensing pixel layer closest to the lens, red light, yellow light, visible light, or infrared light at an interested shortest distance is focused to a light-sensing pixel layer farthest away from the lens, and blue light, green light, red light, or yellow light at an intermediate distance between the infinitely far ultraviolet light, blue light, or cyan light and the red light, yellow light, visible light, or infrared light at the interested shortest distance is focused to an intermediate light-sensing pixel layer.

8. The light-sensing device according to claim 6, wherein the interested shortest distance comprises 2 mm, 5 mm, 7 mm, 1 cm, 2 cm, 3 cm, 5 cm, 7 cm, 10 cm, 20 cm, 30 cm, 40 cm, 50 cm, 60 cm, 70 cm, 80 cm, 100 cm, or 150 cm.

9. The light-sensing device according to claim 1, wherein a light transmission layer is disposed between the at least two light-sensing pixel layers.

10. The light-sensing device according to claim 1, wherein a light-sensing pixel in the light-sensing pixel layer is a front-side light-sensing pixel, a back-side light-sensing pixel, or a bidirectional light-sensing pixel,
wherein when the light-sensing pixel is a bidirectional light-sensing pixel, a manner of selection of a direction by light-sensing thereof is selection of a direction by isolation, selection of a direction by time division, selection of a direction by area division, or selection of a direction by a pixel.

11. The light-sensing device according to claim 1, wherein light-sensing pixels in the light-sensing pixel layer each induce a complementary band or sub-band of ultraviolet, visible light, near-infrared, and far-infrared; or
light-sensing pixels in the light-sensing pixel layer each induce an orthogonal band or a sub-band of ultraviolet, visible light, near-infrared, and far-infrared.

12. The light-sensing device according to claim 11, wherein the complementary band or sub-band is selected from the group consisting of ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum; and
the orthogonal band or sub-band is selected from the group consisting of ultraviolet spectrum, blue spectrum, green spectrum, red spectrum, near-infrared spectrum, far-infrared spectrum, cyan spectrum, yellow spectrum, white spectrum, near-infrared spectrum+far-infrared spectrum, red spectrum+near-infrared spectrum, red spectrum+near-infrared spectrum+far-infrared spectrum, yellow spectrum+near-infrared spectrum, yellow spectrum+near-infrared spectrum+far-infrared spectrum, visible spectrum+near-infrared spectrum+far-infrared spectrum, ultraviolet spectrum+visible spectrum, ultraviolet spectrum+visible spectrum+near-infrared spectrum, and ultraviolet spectrum+visible spectrum+near-infrared spectrum+far-infrared spectrum.

13. The light-sensing device according to claim 1, wherein color arrangement in each light-sensing pixel layer is selected from the group consisting of same arrangement, horizontal arrangement, vertical arrangement, diagonal arrangement, generalized Bayesian arrangement, YUV422 arrangement, transverse YUV422 arrangement, honeycomb arrangement, and uniform arrangement.

14. The light-sensing device according to claim 1, further comprising at least one of a reading circuit for an active pixel, a reading circuit for a passive pixel, or a mixed reading circuit for an active pixel and a passive pixel,
wherein the active pixel comprises an active pixel 3T, 4T, 5T or 6T.

15. The light-sensing device according to claim 1, further comprising a plurality of light-stable transfer and reading pixels capable of transferring and reading a charge or voltage value of one or more light-sensing pixel layers simultaneously, wherein the plurality of light-stable transfer and reading pixels is located at a light-stable pixel transfer and reading layer; or located at a light-sensing pixel layer.

16. The light-sensing device according to claim 15, wherein each light-sensing pixel layer is disposed with a proximate light-stable pixel transfer and reading layer.

17. A depth of field extension method, comprising:
disposing, in a light-sensing device, at least two light-sensing pixel layers capable of inducing a light source, wherein different light-sensing pixel layers sense light signals with different wavelength bands which are orthogonal or complementary to each other, and arranging the at least two light-sensing pixel layers at an interval of a preset distance, so that light signals from different distances and with different wavelengths are focused to the different light-sensing pixel layers by a lens at a specific distance from the light-sensing device.

18. An optical imaging method, comprising:

disposing a lens and a light-sensing device comprising at least two light-sensing pixel layers capable of inducing a light source, wherein different light-sensing pixel layers sense light signals with different wavelength bands which are orthogonal or complementary to each other;

placing the light-sensing device at a specific distance from the lens; and arranging the at least two light-sensing pixel layers at an interval of a preset distance, so that light signals from different distances and with different wavelengths are focused to the different light-sensing pixel layers by the lens at the specific distance from the light-sensing device.

19. An optical imaging system, comprising: a lens and a multi-depth-of-field light-sensing device, wherein the multi-depth-of-field light-sensing device is arranged at a specific distance from the lens, and comprises at least two light-sensing pixel layers capable of inducing a light source, wherein different light-sensing pixel layers sense light signals with different wavelength bands which are orthogonal or complementary to each other, and wherein the at least two light-sensing pixel layers are arranged at an interval of a preset distance, so that light signals from different distances and with different wavelengths are focused to the different light-sensing pixel layers by the lens at the specific distance from the light-sensing device.

20. The optical imaging system according to claim 19, wherein a light signal with a shorter wavelength is focused to a light-sensing pixel layer closer to the lens, and/or, wherein a light signal at a farther distance is focused to a light-sensing pixel layer closer to the lens.

* * * * *